US006998698B2

(12) United States Patent
Inoue et al.

(10) Patent No.: US 6,998,698 B2
(45) Date of Patent: Feb. 14, 2006

(54) MEMORY CELL WITH A PEROVSKITE STRUCTURE VARISTOR

(75) Inventors: Koji Inoue, Ikoma (JP); Koji Hamaguchi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/606,408

(22) Filed: Jun. 25, 2003

(65) Prior Publication Data
US 2004/0036109 A1    Feb. 26, 2004

(30) Foreign Application Priority Data

Jun. 25, 2002   (JP) .............................. 2002-185234
Nov. 29, 2002   (JP) .............................. 2002-347882

(51) Int. Cl.
*H01L 29/00*   (2006.01)
(52) U.S. Cl. ........................ 257/539; 257/537; 257/295
(58) Field of Classification Search ................ 257/295, 257/536, 537, 379, 390, 288, 528; 365/158, 365/145
See application file for complete search history.

(56) References Cited

U.S. PATENT DOCUMENTS

| 5,038,191 | A  | * | 8/1991  | Hasegawa et al. .......... 257/205 |
| 6,130,835 | A  |   | 10/2000 | Scheuerlein |
| 6,204,139 | B1 |   | 3/2001  | Liu et al. |
| 6,276,631 | B1 |   | 8/2001  | Mio et al. |
| 6,278,631 | B1 |   | 8/2001  | Naji |
| 6,314,014 | B1 |   | 11/2001 | Lowrey et al. |
| 6,700,813 | B1 | * | 3/2004  | Inui ........................... 365/158 |
| 2002/0057594 | A1 |   | 5/2002  | Hirai |
| 2003/0198077 | A1 | * | 10/2003 | Ueda et al. ................. 365/145 |
| 2004/0037103 | A1 | * | 2/2004  | Lu et al. ...................... 365/96 |

FOREIGN PATENT DOCUMENTS

WO    WO-00/49659 A1    8/2000

OTHER PUBLICATIONS

S.Q. Liu, N.J. Wu and A. Ignatiev (Nov. 7-Aug. 2001) "A New Concept for Non-Volatile Memory: The Electric-Pulse Induced Resistive Change Effect in Colossal Magnetoresistive Thin Films" IEEE Proceedings, Non-Volatile Memory Technology Symposium 2001, p. 18-24.

S.Q. Liu, N.J. Wu and A. Ignatiev (May 8, 2000)"Electric-pulse-induced reversible resistance change effect in magnetoresistive films" Applied Physics Letters vol. 76, No. 19, p. 2749-2751.

(Continued)

*Primary Examiner*—Bradley K. Smith
(74) *Attorney, Agent, or Firm*—Morrison & Foerster LLP

(57) ABSTRACT

The present invention provides a memory cell having a variable resistor as a memory element, and also provides a memory device comprising the memory cells. The variable resistor is made of a thin-film material (for example, PCMO) or the like having a perovskite structure. So the memory cell can operate at a low voltage and can be highly integrated. The memory cell MC is formed of a combination of a current controlling device and a variable resistor. A field-effect transistor, diode or bipolar transistor is used as the current controlling device. The current controlling device is connected in series with the current path of the variable resistor so as to control a current flowing through the variable resistor.

19 Claims, 36 Drawing Sheets

OTHER PUBLICATIONS

Communication from the European Patent Office mailed on Oct. 17, 2003, for patent application No. EP 03 25 4030. 3 pages total.

Office Action [Summons to Attend Oral Proceedings Pursuant to Rule 71(1) EPC] mailed Jul. 27, 2005, for EP Patent Application No. 03254030.4, two pp.

* cited by examiner

MEMORY CELL WITH A PEROVSKITE STRUCTURE VARISTOR

BACKGROUND OF THE INVENTION

The present invention relates to a memory cell and a memory device.

DESCRIPTION OF THE RELATED ART

A method for changing the electrical characteristics of a thin film and a bulk formed of a thin-film material having a perovskite structure, in particular, a colossal magnetoresistance (CMR) material or a high temperature superconductivity (HTSC) material, by applying one or more short electrical pulses, has been proposed. The intensity of an electric field and the current density thereof by this electrical pulse should be sufficient to change the physical state of the material and should have sufficiently low energy so as not to destroy the material. This electrical pulse may be positive or negative. By repeatedly applying a plurality of electrical pulses, the characteristics of the material can be changed further.

This kind of conventional technology has been disclosed in U.S. Pat. No. 6,204,139, for example. FIGS. 29 and 30 are graphs each showing the relationship between the number of applied pulses and a resistance value in the conventional technology. FIG. 29 shows the relationship between the number of pulses applied to a CMR film grown on a metallic substrate and the resistance value thereof in the conventional technology. In this case, 47 pulses each having an amplitude of 32 V and a pulse width of 71 ns are applied. In these conditions, it is known that the resistance value changes by about one digit as shown in the graph.

In addition, in FIG. 30, the pulse application conditions are changed, that is, 168 pulses each having an amplitude of 27 V and a pulse width of 65 ns are applied. In these conditions, it is known that the resistance value changes by about five digits as shown in the graph.

FIGS. 31 and 32 are graphs showing the dependence of the relationship on pulse polarity in the conventional technology. FIG. 31 shows the relationship between the number of pulses and a resistance value in the case where pulses having +12 V and −12 V are applied. Furthermore, FIG. 32 shows the relationship between the number of pulses and a resistance value in the case where the resistance value is measured after pulses having +51 V and −51 V are applied continuously. As shown in FIGS. 31 and 32, by continuously applying negative pulses after lowering the resistance value by applying positive pulses several times, the resistance value can be increased (to a saturated state in the end). It is considered that this is applicable to memory devices by setting a positive pulse application time as a reset state and by setting a negative pulse application time as a write state.

In the above-mentioned conventional example, CMR thin-films having the above-mentioned characteristics are arranged in an array to form a memory device. FIG. 33 is a perspective view showing a memory array configuration in accordance with the conventional technology. In the memory array shown in FIG. 33, a bottom electrode 26 is formed on a substrate 25, and variable resistors 27, each constituting one bit, and an upper electrode 28 are formed on the bottom electrode 26. A wire 29 is connected to the upper electrode 28 for each bit, that is, for each variable resistor 27, and writing pulses are applied thereto. In addition, also in the case of reading, a current is read from the wire 29 connected to the upper electrode 28 for each bit.

However, the change in the resistance value of the CMR thin film shown in each of FIGS. 31 and 32 is about twice. It thus seems that the change in the resistance value is too small to make a distinction between the reset state and the write state. In addition, since the voltage applied to this CMR thin film is high, this thin film is not suited for memory devices that are desired to operate at a low voltage.

On the basis of this result, the applicants of the present invention were able to obtain new characteristics by using a CMR material, such as PCMO (Pr$_{0.7}$Ca$_{0.3}$MnO$_3$), having the same perovskite structure as that of U.S. Pat. No. 6,204,139, and by applying one or more electrical pulses. In other words, by applying about ±5 V low-voltage pulses, a characteristic wherein the resistance value of the thin-film material is changed from several hundreds Ω to about 1 MΩ is obtained.

However, in the memory array shown in FIG. 33, a wire is connected to an electrode for each bit, and a write-use pulse is applied through this wire at the time of a write operation. Furthermore, at the time of a read operation, a current is read from the wire connected to the electrode for each bit. Hence, the characteristics of the thin-film material can be evaluated, but there is a problem of being unable to raise the degree of integration of the array serving as a memory device.

In addition, when write, read and reset operations are carried out, all the operations are controlled by input signals from the outside of the memory device. Unlike the conventional memory device, this memory device is not configured so that the write, read and reset operations are controlled inside the memory device.

FIG. 34 is a circuit diagram showing a configuration example of a conventional memory array. Variable resistors Rc made of the PCMO material are disposed in a 4 by 4 matrix, thereby forming a memory array 10. One terminal of each variable resistor Rc is connected to one of word lines W1 to W4, one terminal to each line, and the other terminal thereof is connected to one of bit lines B1 to B4, one terminal to each line. A peripheral circuit 32 is provided adjacent to the memory array 10. A bit pass transistor 34 is connected to one of the bit lines B1 to B4, one transistor to each line, thereby forming a path to an inverter 38. A load transistor 36 is connected between the bit pass transistor 34 and the inverter 38. With this configuration, it is possible to carry out read and write operations at each of the variable resistors Rc of the memory array 10.

In this conventional memory array, the memory can be operated at a low voltage. However, leak current paths to memory cells adjacent to a memory cell to be accessed are made, whereby the current value at the time of the read operation cannot be evaluated correctly (read disturb). Furthermore, at the time of the write operation, leak currents to adjacent cells also generate, thereby causing danger of being unable to carry out the write operation correctly (write disturb).

In the case of the read operation, for example, in order to read the resistance value of the variable resistor Rca in a selected memory cell, a power source voltage Vcc is applied to the word line W3, 0 V (GND) is applied to the bit line B2, and the other bit lines B1, B3 and B4 and the other word lines W1, W2 and W4 are made open. By turning ON a bit pass transistor 34a, a current path indicated by arrow A1 can be made, whereby a resistance value can be read. However, current paths indicated by arrows A2 and A3 are also made at the variable resistors Rc adjacent to the variable resistor Rca, whereby it is impossible to read only the resistance value of the variable resistor Rca in the selected memory cell (read disturb).

SUMMARY OF THE INVENTION

In consideration of these circumstances, an object of the present invention is to provide a memory cell comprising a variable resistor serving as a memory element and having a resistance body made of a thin-film material (for example, PCMO) or the like having a perovskite structure, and to provide a memory device comprising the memory cells. The memory cell comprising this variable resistor serving as a memory element and the memory device comprising the memory cells can operate at a low voltage and can be highly integrated.

Furthermore, another object of the present invention is to provide a memory device equipped with memory peripheral circuits causing no leak currents to flow to adjacent memory cells when a memory cell is accessed.

The memory cell in accordance with the present invention is characterized in that it comprises a variable resistor and a current controlling device for controlling a current flowing through the variable resistor. The memory cell in accordance with the present invention is characterized in that the current controlling device is a field-effect transistor. The memory cell in accordance with the present invention is characterized in that the current controlling device is a diode. The memory cell in accordance with the present invention is characterized in that the current controlling device is a bipolar transistor.

The memory device in accordance with the present invention comprises a plurality of memory cells, each comprising a variable resistor and a field-effect transistor for controlling a current flowing through the variable resistor, arranged in a matrix; word lines for connecting the gates of the field-effect transistors in common in the row direction of the matrix; source drive lines for connecting the sources of the field-effect transistors in common in the row direction of the matrix; and bit lines for connecting one terminal of each of the variable resistors in common in the column direction of the matrix, wherein the drains of the field-effect transistors are connected to the other terminals of the variable resistors.

The memory device in accordance with the present invention comprises a plurality of memory cells, each comprising a variable resistor and a diode for controlling a current flowing through the variable resistor, arranged in a matrix; word lines for connecting the anodes of the diodes in common in the row direction of the matrix; and bit lines for connecting one terminal of each of the variable resistors in common in the column direction of the matrix, wherein the cathodes of the diodes are connected to the other terminals of the variable resistors.

The memory device in accordance with the present invention comprises a plurality of memory cells, each comprising a variable resistor and a bipolar transistor for controlling a current flowing through the variable resistor, arranged in a matrix; a common-connected portion for connecting the collectors of the bipolar transistors in common; word lines for connecting the bases of the bipolar transistors in common in the row direction of the matrix; and bit lines for connecting one terminal of each of the variable resistors in common in the column direction of the matrix, wherein the emitters of the bipolar transistors are connected to the other terminals of the variable resistors.

In the memory device in accordance with the present invention, the word lines are connected to a row decoder for selecting the word lines, the bit lines are connected to a column decoder for selecting the bit lines, and a readout circuit is connected to the column decoder to read memory data from the memory cells.

In the present invention, since the memory cell comprises a variable resistor and a current controlling device for controlling a current flowing through the variable resistor, a memory cell having a simple structure can be obtained, whereby a memory cell suited for a large-capacity memory device can be attained.

In the present invention, since the memory cells, each comprising a variable resistor and a current controlling device for controlling a current flowing through the variable resistor, are arranged in a matrix to form a memory array, and peripheral circuits, such as a column decoder, are integrated with the memory array, a memory device suited for a large-capacity memory can be attained.

The above and further objects and features of the invention will more fully be apparent from the following detailed description with accompanying drawings.

DETAILED DESCRIPTION OF THE PREFERRED EMBODIMENTS

A memory device (and memory cells) in accordance with the present invention will be described below in detail by using drawings. In the present invention, memory cells (memory array) are each formed of a variable resistor serving as a memory element and having a resistance body made of a thin film of a CMR material (for example, PCMO) and having a resistance value changing by about two digits when low-voltage pulses are applied as described above. In addition, specific memory peripheral circuits for carrying out write, read and reset operations for the memory cells (memory array) are shown. It is of course understood by those skilled in the art that the memory device (and memory cells) in accordance with the present invention are integrated together with memory peripheral circuits on a semiconductor substrate (for example, silicon) and can operate as a semiconductor device (semiconductor memory device).

The variable resistor is made of a thin-film material (for example, PCMO, more specifically, $Pr_{0.7}Ca_{0.3}MnO_3$) or the like having the above-mentioned characteristics. This variable resistor is combined with a current controlling device for controlling a current flowing through the variable resistor to form the memory cell in accordance with the present invention.

[Embodiment 1]

Figure 1B:
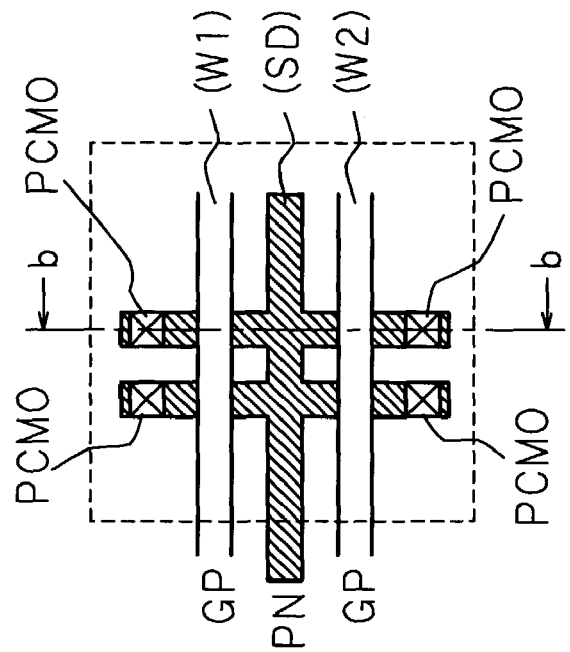
FIG. 1B is a schematic plan view showing the layout pattern of FIG. 1A.
Figure 1C:
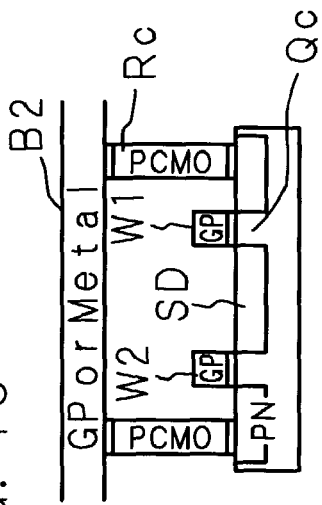
FIG. 1C is a schematic sectional view taken on arrow bb of FIG. 1B.
Figure 1A:
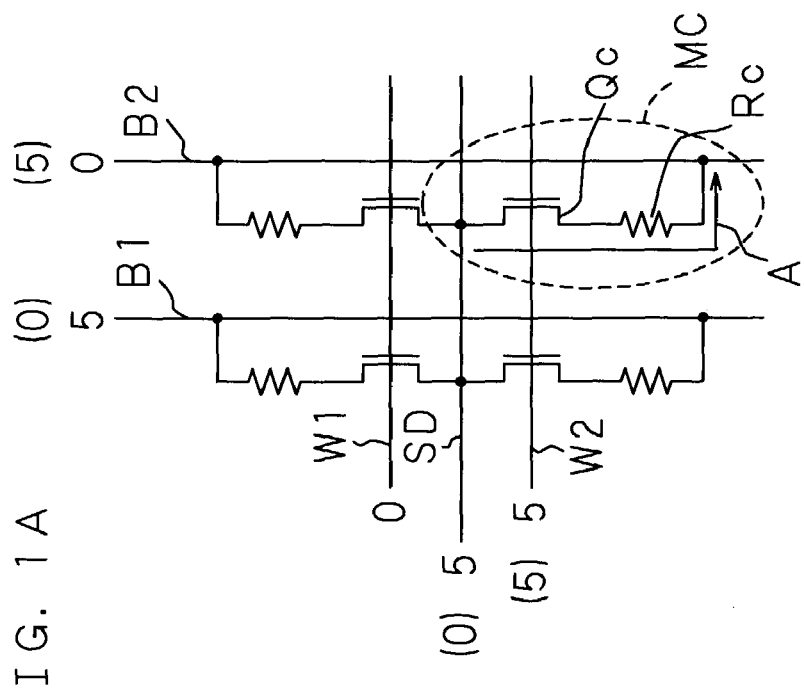
FIG. 1A is a circuit diagram of a memory array in accordance with the present invention.

FIGS. 1A to 1C are explanatory views showing the configuration of a memory device (memory cells and a memory array) in accordance with the present invention. FIG. 1A is a circuit diagram of the memory array in accordance with the present invention. FIG. 1B is a schematic plan view showing the layout pattern of FIG. 1A. FIG. 1C is a schematic sectional view taken on arrow bb of FIG. 1B. In FIG. 1C, oblique lines indicating a sectional plane are omitted (this omission is also applicable to other sectional views).

MC designates a memory cell (hereafter also referred to as a cell). MC is formed of a combination of a current controlling device Qc and a variable resistor Rc. A field-effect transistor (FET, hereafter also referred to as a Tr) is used as the current controlling device Qc (hereafter, the current controlling device Qc formed of a field-effect transistor is also referred to as a Tr Qc). The Tr Qc is connected in series with the current path of the variable resistor Rc so as to control the current flowing through the variable resistor Rc. Since this memory cell MC is a combination of one current controlling device (field-effect transistor) Qc and one variable resistor Rc, it is referred to as a 1T1R type memory cell.

A configuration wherein memory cells MC are arranged in a 2 by 2 matrix to form a memory array is shown. The gates of the Trs Qc are connected in common in the row direction of the matrix, thereby forming word lines W1 and W2. The sources of the Trs Qc are connected in common, thereby forming a source drive line SD. The drains of the Trs QC are each connected to one terminal of each of the variable resistors Rc, and the other terminals of the variable resistors Rc are connected in common in the column direction of the matrix, thereby forming bit lines B 1 and B2. As a result, a memory array is formed. Hence, in the memory array (a matrix formed of a plurality of memory cells MC), the word lines W1 and W2 and the source drive line SD extend in the row direction, and the bit lines B 1 and B2 extend in the column direction.

In the case when the source drive line SD is set at 5 V, the word line W1 is set at 0 V, the word line W2 is set at 5 V, the bit line B 1 is set at 5 V, and the bit line B2 is set at 0 V, a current path is formed as indicated by arrow A, whereby a potential difference is generated across the variable resistor Rc and its resistance value can be changed. The source drive line SD is formed of a PN layer (diffusion layer). The word lines W1 and W2 are formed of GP lines (polycrystal silicon wiring). The bit lines B1 and B2 are formed of GP lines (polycrystal silicon wiring) or metal wires. The variable resistor Rc is formed of a PCMO film and disposed on the drain of the Tr Qc, and the bit lines B1 and B2 are disposed on the PCMO films. Contact metal layers are formed at the connection portions of the PCMO films and the bit lines B1 and B2 and the connection portions of the PCMO films and the Trs Qc. For example, platinum (Pt), iridium, etc. can be used for the contact metal layers.

In addition, the word lines W1 and W2 are connected to a row decoder (not shown), and signals are applied from the row decoder to the word lines W1 and W2 as necessary, thereby selecting the word lines W1 and W2. The bit lines B1 and B2 are connected to a column decoder (not shown), and signals are applied from the column decoder to the bit lines B1 and B2 as necessary thereby selecting the bit lines B1 and B2.

The operation method of the memory array will be described below. When the memory array is inactive (in a precharge state), 0 V (the GND level) is applied to all the bit lines B1 and B2, and 0 V is applied to all the word lines W1 and W2. In addition, 0 V is also applied to all the source drive lines SD for supplying a source voltage to the Trs Qc in the respective memory cells.

(Write Operation)

Figure 2:
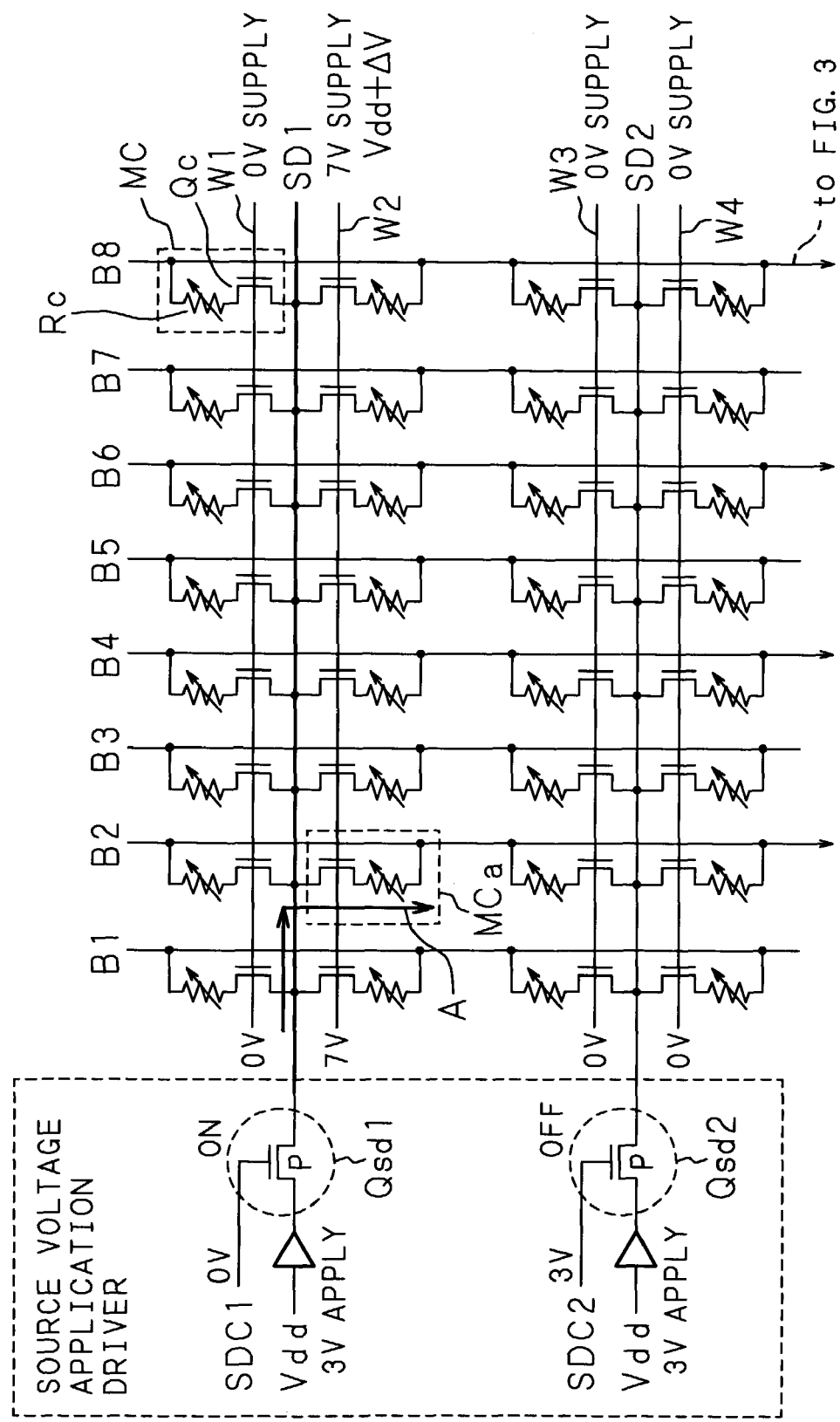
FIG. 2 is a circuit diagram illustrating a write operation for a memory cell in accordance with the present invention.
Figure 3:
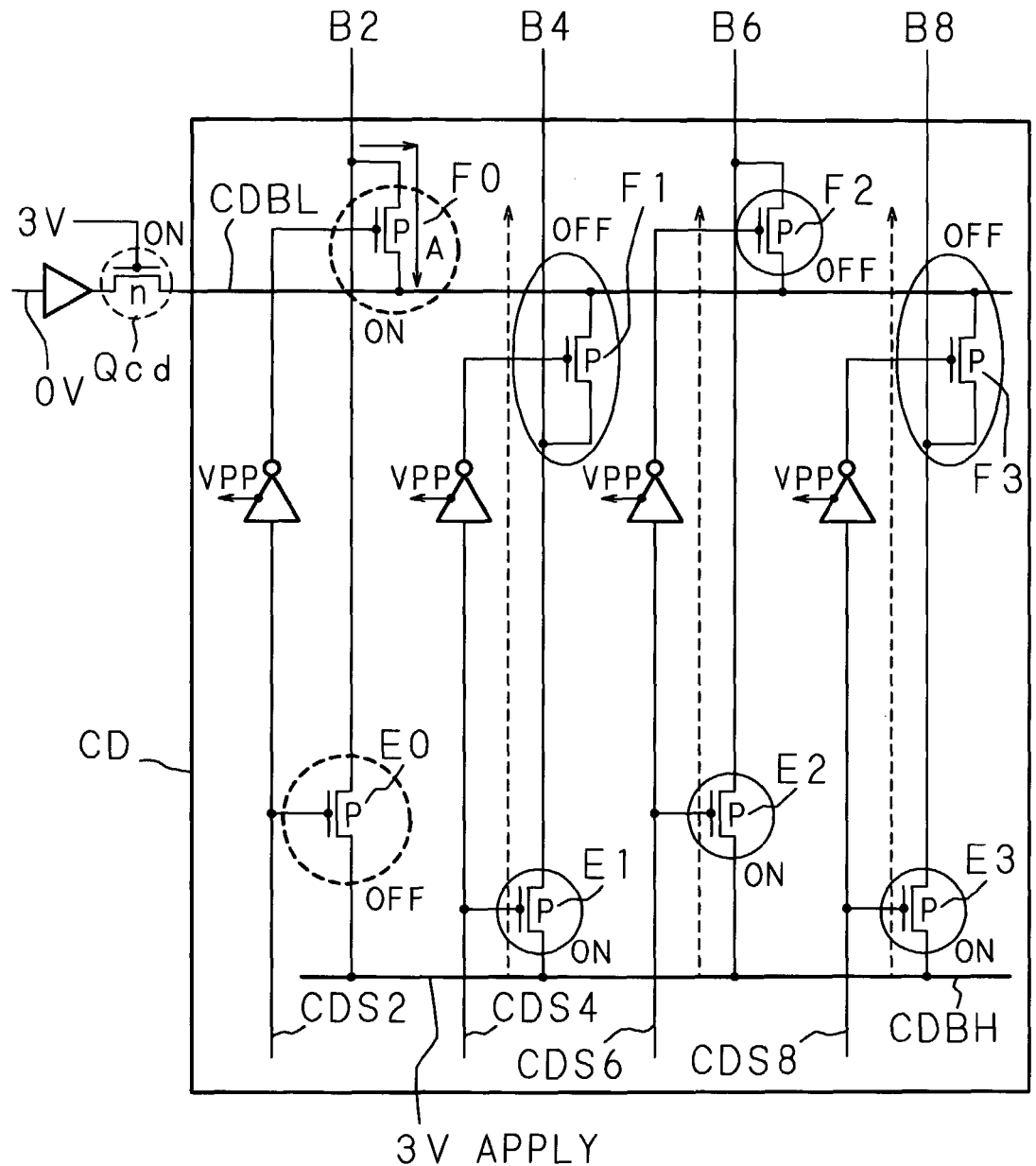
FIG. 3 is a circuit diagram illustrating the write operation for the memory cell in accordance with the present invention.

FIGS. 2 and 3 are circuit diagrams illustrating a write operation for a memory cell in accordance with the present invention. FIG. 2 shows a memory array area, and FIG. 3 shows a column decoder. The bit lines B2, B4, B6 and B8 of FIG. 2 are extended and connected to the bit lines B2, B4, B6 and B8 of FIG. 3.

The memory array is formed by arranging the memory cells MC in an 8 by 4 matrix. Just as in the case of FIG. 1, bit lines B1 to B8, word lines W1 to W4, and source drive lines SD1 and SD2 are formed. The source drive lines SD1 and SD2 are connected to source voltage application drivers SDC1 and SDC2, respectively.

A column decoder CD comprises a Tr group of Trs E0, E1, E2 and E3 and a selection transistor group of Trs F0, F1, F2 and F3 and the like. One terminal of each of the Trs E0, E1, E2 and E3 is connected to one of the bit lines B2, B4, B6 and B8, and the other terminals thereof are connected to a potential line CDBH having a potential Vdd. One terminal of each of the Trs F0, F1, F2 and F3 is connected to one of the bit lines B2, B4, B6 and B8, and the other terminals thereof are connected to a potential line CDBL (0 V is applied via a Tr Qcd). It is needless to say that a column decoder CD is also connected similarly to the bit lines B1, B3, B5 and B7. The Trs E0, E1, E2 and E3 and the Trs F0, F1, F2 and F3 are controlled by column address signals (lines) CDS2, CDS4, CDS6 and CDS8. Furthermore, the inverted signals of the signals input to the Trs E0, E1, E2 and E3 are input to the Trs F0, F1, F2 and F3.

To carry out a write operation for a selected memory cell MCa (to raise the resistance value of the variable resistor Rc in the memory cell MCa), 0 V is applied to the bit line B2 connected to the variable resistor Rc in the selected memory cell MCa. To the other bit lines B1 and B3 to B8, Vdd (for example, 3 V; this is similarly applicable to the following descriptions) is applied. In addition, 2Vdd+ΔV (6+1=7 V) is applied to the word line W2 connected to the gate of the Tr Qc in the memory cell MCa to be accessed, thereby reducing voltage drop due to the Tr Qc in the memory cell MCa. Furthermore, 0 V is applied to the word lines W1, W3 and W4 connected to non-selected memory cells MC, thereby turning OFF the Trs Qc.

By driving a source voltage application driver SDC1 (by turning ON a Tr Qsd1 so as to output Vdd), Vdd (3 V) is applied to the source drive line SD1, that is, the source connected to the selected memory cell MCa. Furthermore, by turning OFF a source voltage application driver SDC2 (by turning OFF a Tr Qsd2 so as not to output Vdd, no voltage is applied to the sources connected to the non-selected memory cells MC.

In this input condition, only one current path from the source drive line SD1 through the Tr Qc in the selected memory cell MCa to the bit line B2 is formed as indicated by arrow A, whereby a voltage can be applied to the variable resistor Rc in the selected memory cell MCa and a write operation can be carried out at the variable resistor Rc (the variable resistance value in the memory cell is raised). In other words, since a potential difference close to Vdd (3 V) is obtained across the variable resistor Rc in the selected memory cell MCa, the resistance value of the variable resistor Rc rises from several hundred Ω to about 1 MΩ. By this series of operations, the write operation is carried out only in the selected memory cell MCa.

At this time, considerations should be given so that no potential difference occurs and no resistance value changes across each of the variable resistors Rc in the non-selected memory cells MC. For this purpose, the Trs E1, E2 and E3 in the column decoder CD are turned ON by the column address signals (lines) CDS4 (DISABLE), CDS6 (DISABLE) and CDS8 (DISABLE), whereby Vdd (3 V) is applied to the bit lines B4, B6 and B8. On the other hand, the Tr E0 connected to the bit line B2 connected to the selected memory cell MCa is turned OFF on the basis of the column address signal CDS2 (ENABLE) which has been input, whereby the selected Tr F0 is turned ON and the potential of the bit line B2 becomes 0 V, the potential of the potential line CDBL, via the current path indicated by arrow A. By turning ON the Tr Qcd, the potential of the potential line CDBL is supplied. The potential, 0 V, of the potential line CDBL is obtained by a 0 V pulse applied to the Tr Qcd. By setting each potential as described above, improper writing (write disturb) at cells adjacent to the selected memory cell MCa can be prevented.

(Reset Operation)

Figure 4:
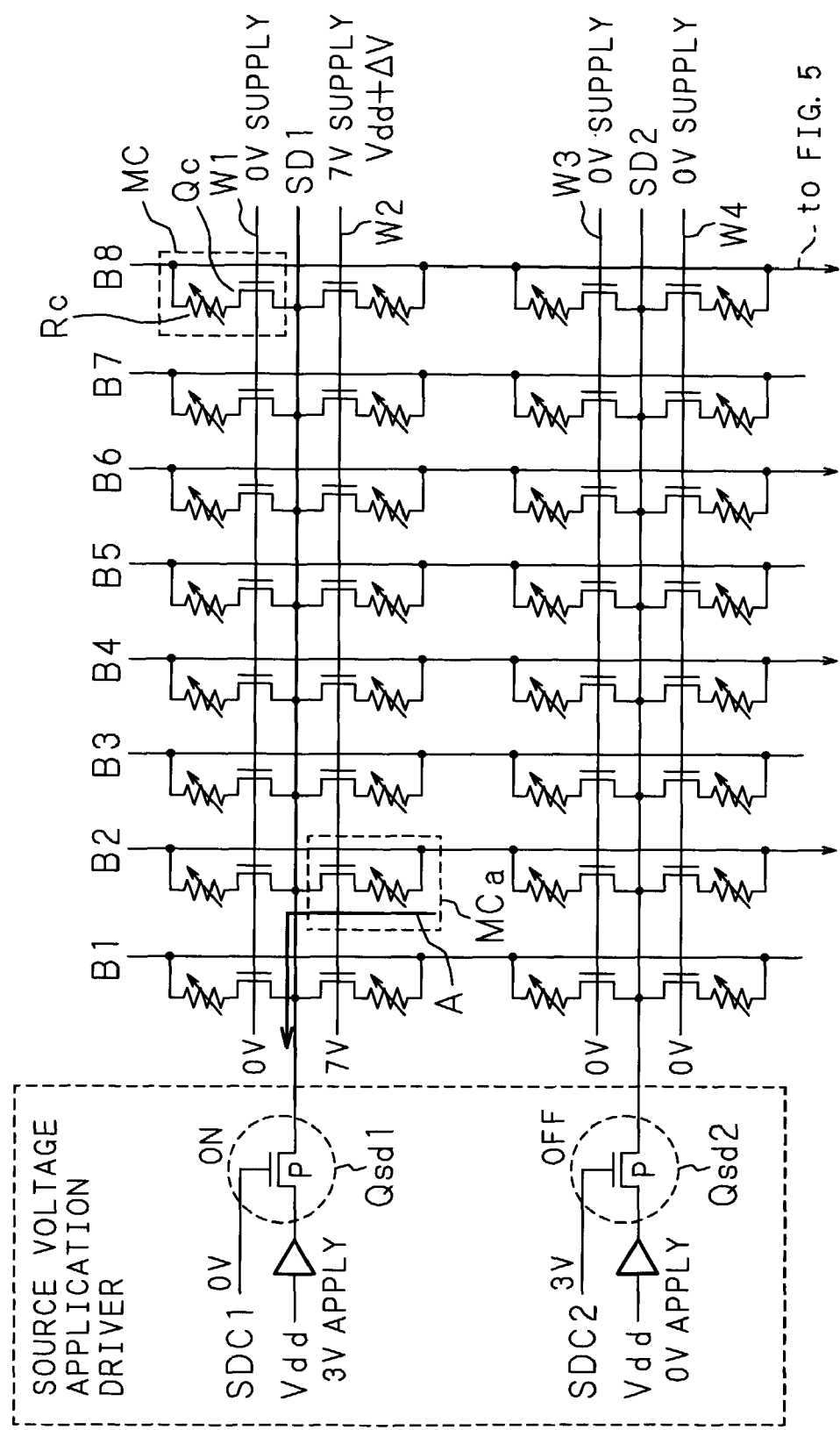
FIG. 4 is a circuit diagram illustrating a reset operation for a memory cell in accordance with the present invention.
Figure 5:
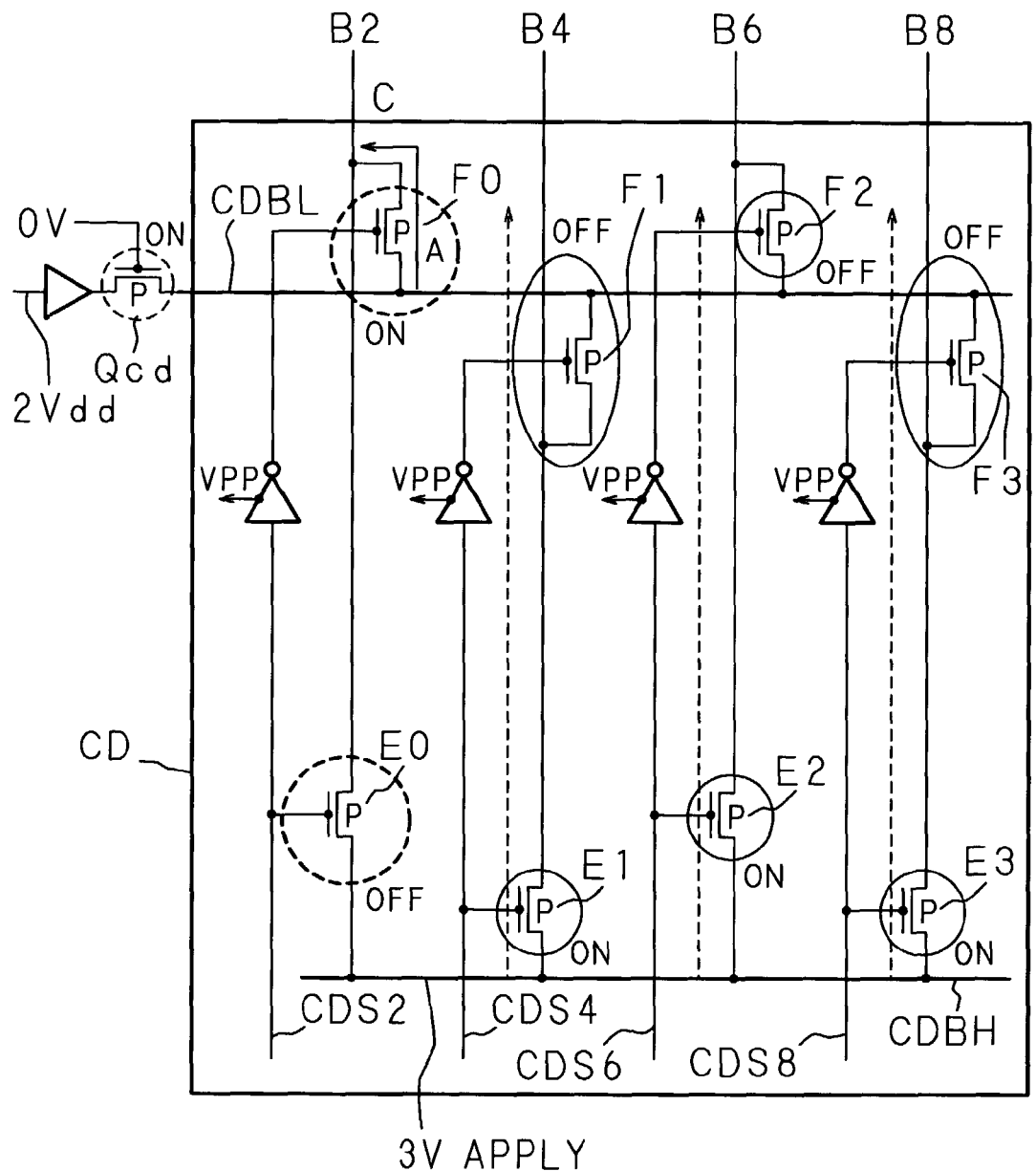
FIG. 5 is a circuit diagram illustrating the reset operation for the memory cell in accordance with the present invention.

FIGS. 4 and 5 are circuit diagrams illustrating a reset operation for a memory cell in accordance with the present invention. FIG. 4 shows a memory array area, and FIG. 5 shows a column decoder. The circuit configurations themselves are similar to those shown in FIGS. 2 and 3. The same components are designated by the same codes, and their detailed explanations are omitted.

To reset the resistance value of the variable resistor Rc in the selected memory cell MCa, 2Vdd (6 V) is applied to the bit line B2 connected to the variable resistor Rc in the selected memory cell MCa. This 2Vdd (6 V) is supplied by the potential line CDBL via the Tr F0. The potential of the potential line CDBL is obtained by a pulse of 2Vdd that is applied to the Tr Qcd to turn it ON. In addition, 2Vdd+ΔV (6+1=7 V) is applied to the word line W2 connected to the gate of the Tr Qc in the selected memory cell MCa, and at the other word lines W1, W3 and W4, the 0 V application state remaining after the inactive state is maintained.

By driving the source voltage application driver SDC1 (by turning ON the Tr Qsd1 so as to output Vdd), Vdd (3 V) is applied to the source drive line SD1 connected to the source of the Tr Qc in the selected memory cell MCa. Furthermore, by applying Vdd to the non-selected bit lines B1 and B3 to B8, a countermeasure is taken so that no potential difference occurs across the variable resistor Rc in each of the non-selected memory cells. In other words, just as in the case of the above explanation, by turning ON the Trs E1, E2 and E3 in the column decoder CD by using the column address signals (lines) CDS4, CDS6 and CDS8, Vdd (3 V) is applied from the potential line CDBH to the bit lines B4, B6 and B8 (FIG. 5). On the other hand, the Tr E0 connected to the bit line B2 connected to the selected memory cell MCa is turned OFF on the basis of the column address signal CDS2 having been input, whereby the selected Tr F0 is turned ON. Hence, the potential of the bit line B2 is set at the potential 2Vdd of the potential line CDBL via the current path indicated by arrow A.

In this input condition, only one current path from the bit line B2 through the TR Qc in the selected memory cell MCa to the source drive line SD1 is formed as indicated by arrow A, whereby a voltage can be applied to the variable resistor Rc in the selected memory cell MCa and the reset operation (the reduction of the resistance value) for the variable resistor Rc can be carried out. By applying 2Vdd from this bit line B2, the resistance value of the variable resistor Rc lowers to several hundred Ω. By this series of operations, the reset operation for write data is carried out only in the selected memory cell MCa.

(Read Operation)

Figure 6:
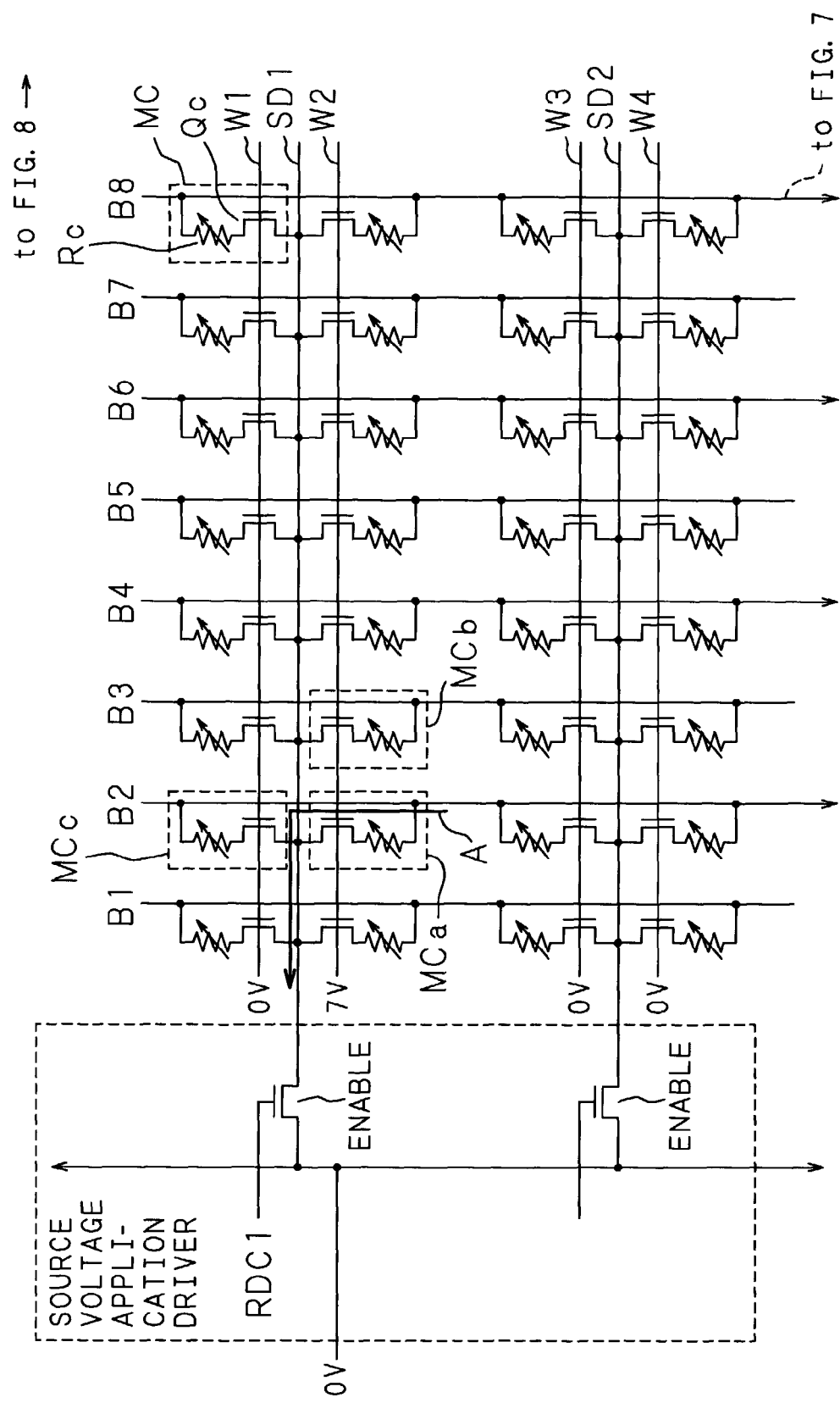
FIG. 6 is a circuit diagram illustrating a read operation for a memory cell in accordance with the present invention.
Figure 7:
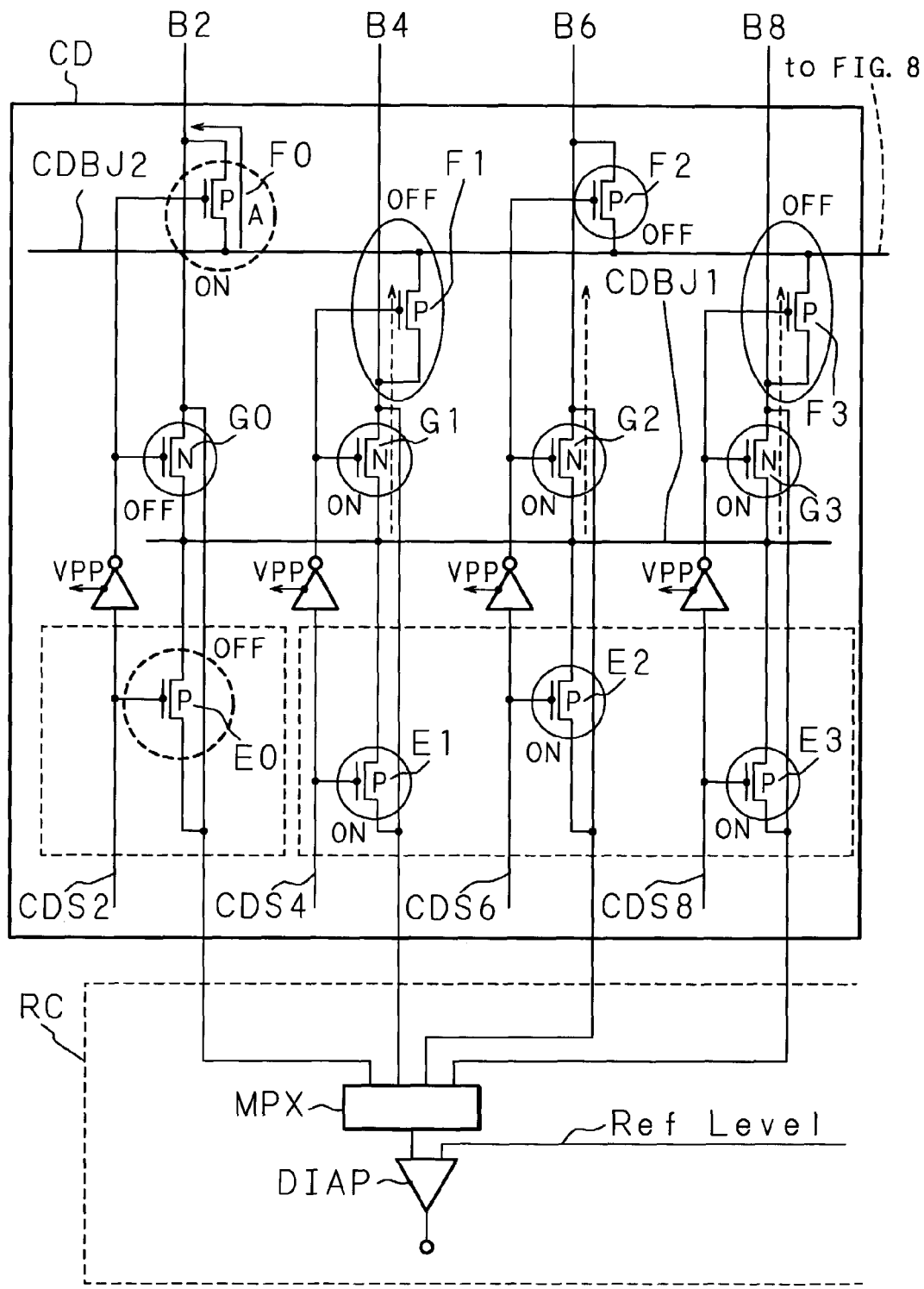
FIG. 7 is a circuit diagram illustrating the read operation for the memory cell in accordance with the present invention.
Figure 8:
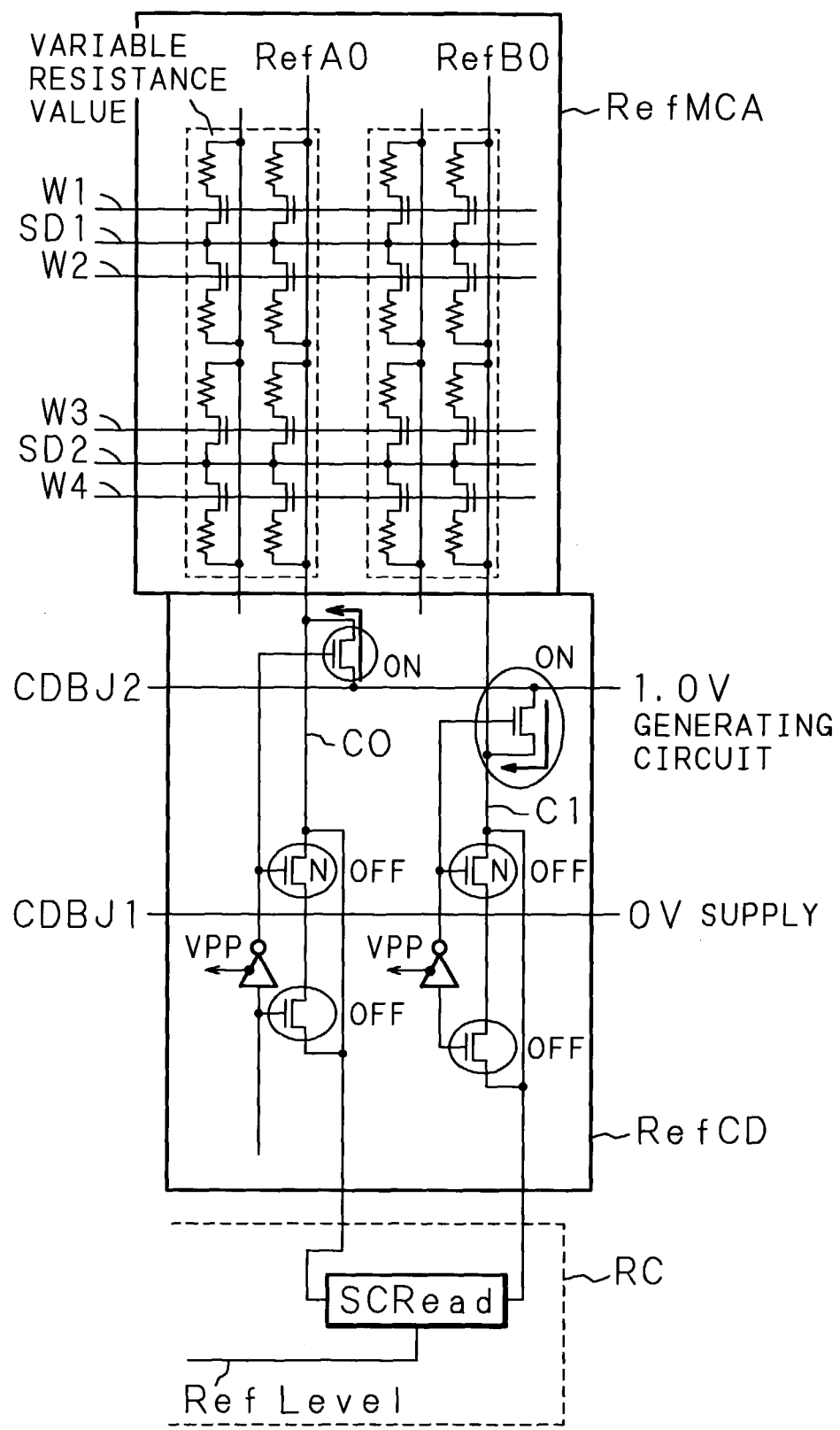
FIG. 8 is a circuit diagram illustrating the read operation for the memory cell in accordance with the present invention.

FIGS. 6, 7 and 8 are circuit diagrams illustrating a read operation for a memory cell in accordance with the present invention. FIG. 6 shows a memory array area, FIG. 7 shows a column decoder and a portion of a readout circuit, and FIG. 8 shows a Ref-use memory cell array, a Ref-use column decoder and a portion of a readout circuit. The circuit configurations are basically similar to those shown in FIGS. 2 to 5. The same components are designated by the same codes, and their detailed explanations are omitted. The readout circuit RC comprises a multiplexer MPX, a differential amplifier DIAP, a readout short circuit SCRead, etc.

When this memory array is inactive (in a precharge state), 0 V (the GND level) is applied to all the bit lines B1 to B8, and 0 V is applied to all the word lines W1 to W4, just as in the case of the write operation.

Next, 0 V is applied to the source drive line SD1 connected to the selected memory cell MCa, and Vdd/2 (1.5 V) or 1.0 V is applied to the bit line B2. Vdd/2 is generated by a Vdd/2 generating circuit J2 and supplied via a potential line CDBJ2. A voltage of 2Vdd+ΔV (6+1=7 V) is applied only to the word line W2 connected to the gate of the Tr Qc in the selected memory cell MCa. In addition, at the other word lines W1, W3 and W4, the 0 V application state remaining after the precharge state is maintained. Furthermore, on the basis of the column address signals (lines) CDS2, CDS4, CDS6 and CDS8 which have been input, 0 V is supplied to the bit lines B4, B6 and B8 (FIG. 7) other than the bit line B2 connected to the selected memory cell MCa. The supply of the 0 V is done via the CDBJ1. Hence, a countermeasure is taken so that no potential difference occurs and no resistance value changes across each of the variable resistors Rc in the non-selected memory cells.

On the basis of the column address signals (lines) CDS2 (ENABLE), CDS4 (DISABLE), CDS6 (DISABLE) and CDS8 (DISABLE) having been input, only the Trs E0 and G0 connected to the bit line B2 connected to the selected memory cell MCa are turned OFF, and the other Trs E1, E2, E3, G1, G2 and G3 in the column decoder CD are all turned ON. Hence, 0 V can be supplied from the potential line CDBJ1 to the bit lines B4, B6 and B8 other than the bit line B2 connected to the selected memory cell MCa.

In addition, on the basis of the column address signals (lines) CDS2 (ENABLE), CDS4 (DISABLE), CDS6 (DISABLE) and CDS8 (DISABLE) which have been input, only the Tr F0 among the Trs F0, F1, F2 and F3 connected to the potential line CDBJ2 is turned ON, and Vdd/2 (1.5 V) or 1.0 V is supplied only to the bit line B2 connected to the selected memory cell MCa. As a result, only one current path from the source drive line SD1 through the Tr Qc in the selected memory cell MCa to the bit line B2 is formed as indicated by arrow A, and a read operation is carried out.

Disturb (disturb prevention) at a reading time at memory cells MCb and MCc adjacent to the selected memory cell MCa will be described below. Since 0 V is supplied from the column decoder CD to the memory cell MCb connected to the source drive line SD1 connected to a read-use 0 V drive circuit RDC1 that becomes active, no potential difference occurs and no resistance value changes across the variable resistor Rc in the memory cell MCb. In addition, in the memory cell MCc, the Tr Qc in the cell is turned OFF, and no potential difference occurs and no resistance value changes across the variable resistor Rc in the memory cell MCc. On the other hand, in the memory cells connected to the other word lines, the Trs Qc in the memory cells are turned OFF, whereby no potential difference occurs across each of the variable resistors Rc in the cells. Hence, no change occurs in the resistance values of the variable resistors Rc in the memory cells other than the cell to be accessed. In other words, by setting the respective potentials as described above, improper reading (read disturb) at cells adjacent to the selected memory cell MCa can be prevented.

By generating a reference potential of 1.5 V (or 1.0 V) by resistance division and by inputting the reference potential to the differential amplifier, the read-use 1.5 V generating circuit J2 or 1.0 V generating circuit can generate a target voltage, that is, 1.5 V or 1.0 V.

In addition, in the read operation, as shown in FIGS. 6 and 7, the outputs from the respective bit lines are input to the multiplexer MPX in the readout circuit RC, and each output value of the multiplexer MPX is compared with the Ref Level by the differential amplifier DIAP, whereby data stored in each memory cell MC is identified as 1 or 0.

As described above, the Ref Level serving as the reference value of the differential amplifier DIAP is generated by a Ref-use memory cell array RefMCA and a Ref-use column decoder RefCD. When the selected memory cell MCa is accessed, the source drive line SD1 is accessed, and the word line W2 is accessed, whereby a memory cell RefA0 and a memory cell RefB0 for generating the Ref Level are accessed simultaneously (see FIG. 8). Vdd/2 is supplied from the potential line CDBJ2 to the Ref-use bit line C0 and the Ref-use bit line C1 of the Ref-use column decoder RefCD, whereby the data of the memory cell RefA0 and the data of the memory cell RefB0 are output to the Ref-use bit line C0 and the Ref-use bit line C1.

A large resistance value is set in one side of the Ref-use memory cell array RefMCA in advance, and a small resistance value is set in the other side thereof in advance. Hence, the Ref-use bit line C0 read from the memory cell RefA0 has a high level, and the Ref-use bit line C1 read from the memory cell RefB0 has a low level. By doing short the signal of the Ref-use bit line C0 and the signal of the Ref-use bit line C1 at the readout short circuit SCRead in the readout circuit RC, an intermediate value of these signals is obtained. This level is input as the Ref Level of the differential amplifier DIAP in the readout circuit RC. The Ref Level is compared with the readout data output from the multiplexer MPX by the differential amplifier DIAP, whereby data stored in each memory cell MC is identified as 1 or 0 and a read operation is carried out.

Figure 9:
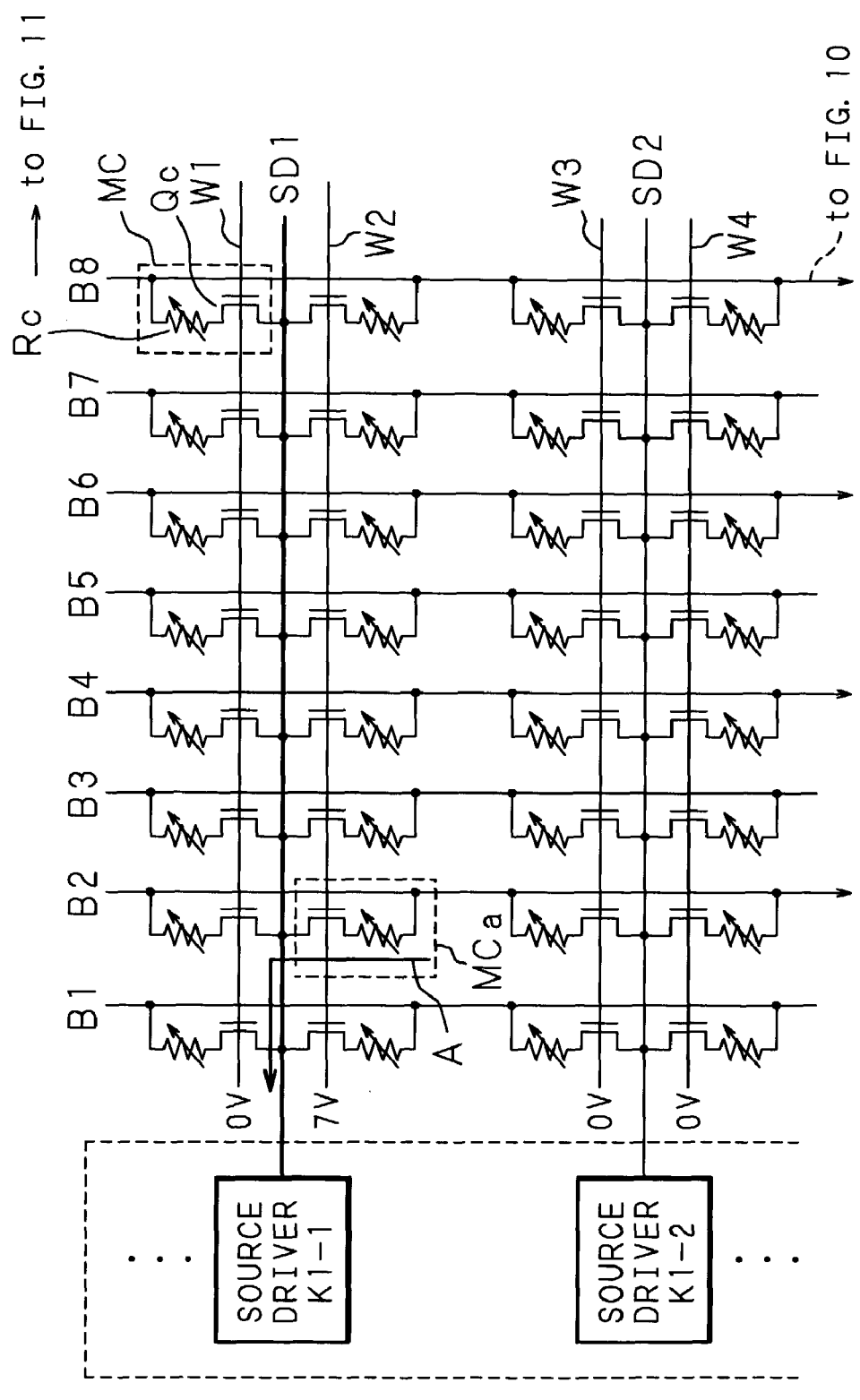
FIG. 9 is a circuit diagram showing the placement of peripheral circuits for the memory cells in accordance with the present invention.
Figure 10:
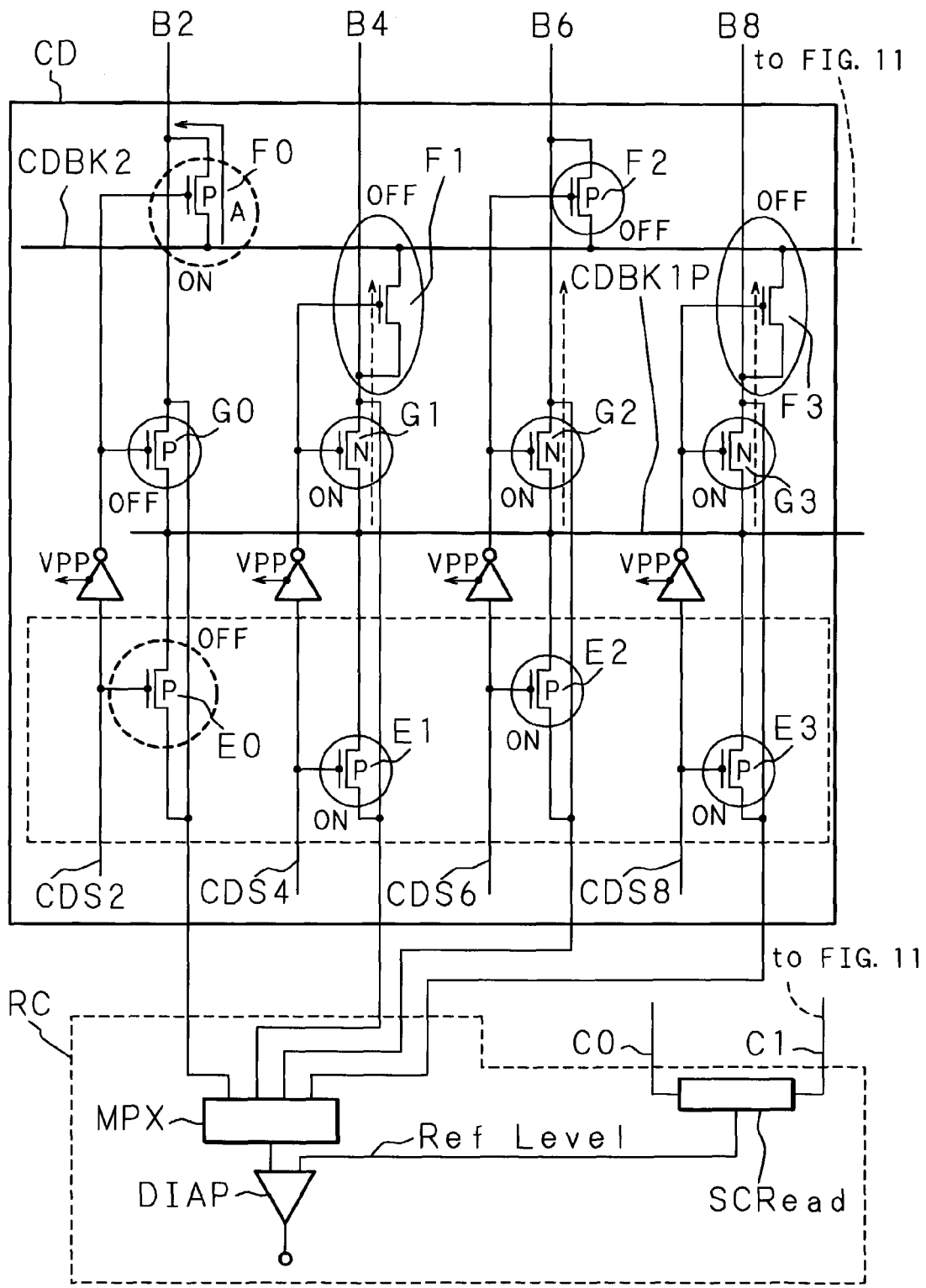
FIG. 10 is a circuit diagram showing the placement of peripheral circuits of the memory cells in accordance with the present invention.
Figure 11:
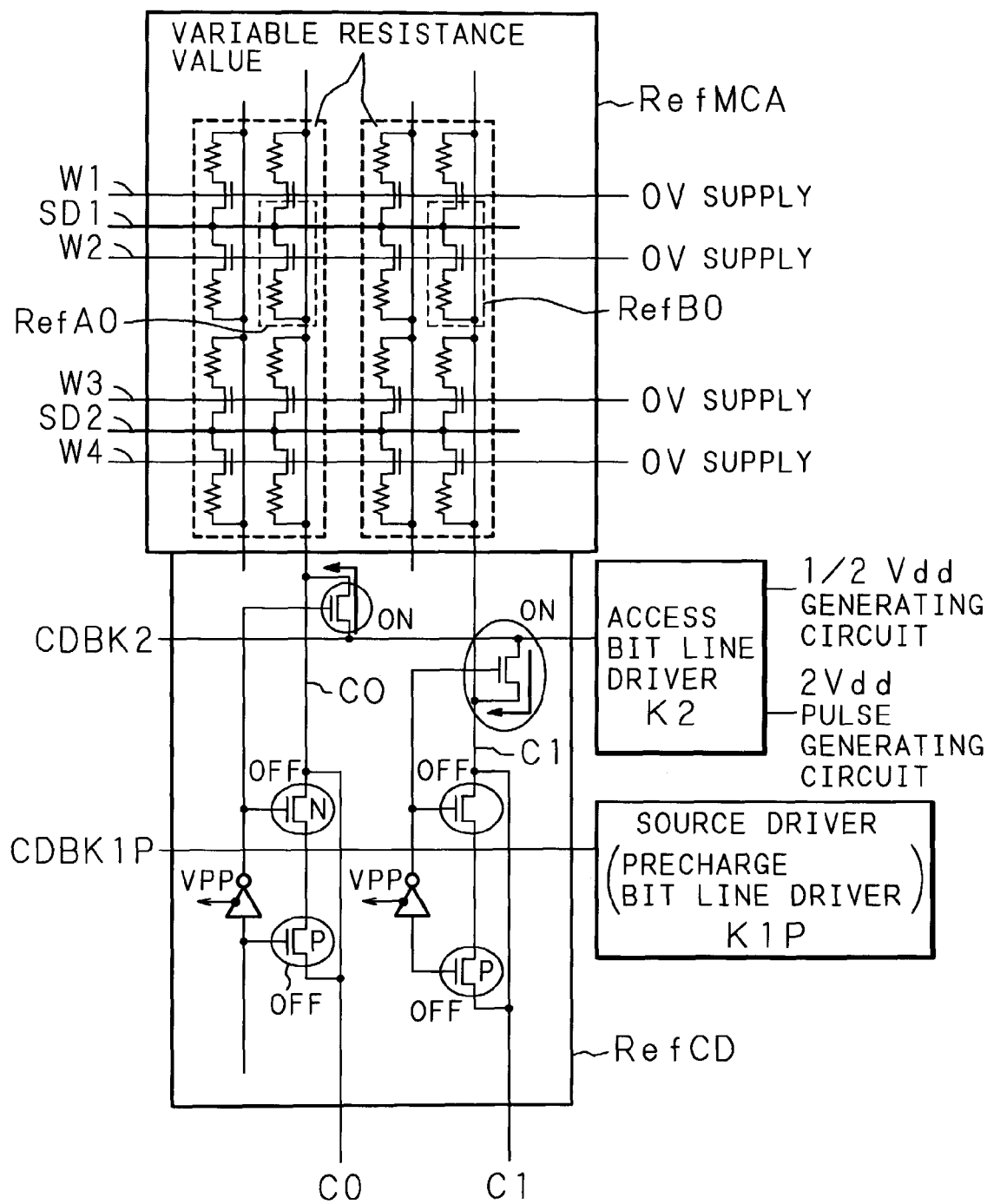
FIG. 11 is a circuit diagram showing the placement of peripheral circuits of the memory cells in accordance with the present invention.

FIGS. 9, 10 and 11 are circuit diagrams showing the placement of memory cell peripheral circuits in accordance with the present invention. The placement of various drivers required for write, reset and read operations for the memory cells MC is shown. FIG. 9 shows source drivers K1 (K1-1, K1-2) and a memory array. FIG. 10 shows a column decoder CD and a readout circuit RC. FIG. 11 shows a Ref-use memory cell array RefMCA, a Ref-use column decoder RefCD, an access bit line potential supply driver K2 (an access bit line driver K2) and a source driver (a precharge bit line driver) K1P. The circuit configurations are basically similar to those shown in FIGS. 2 to 8. The same components are designated by the same codes, and their detailed explanations are omitted.

The source drivers K1-1 and K1-2 drive the source drive lines SD1 and SD2, respectively. The source drive lines SD1 and SD2 are set at Vdd at the write time, Vdd at the reset time, and 0 V at the read time. The source driver K1 also serves as a source voltage application driver in FIG. 4 and the like.

The access bit line potential supply driver K2 (access bit line driver K2) supplies a write potential, reset potential or read potential to a selected bit line (for example, the bit line B2) via a potential line CDBK2. The potential line CDBK2 is set at 0 V at the write time, 2Vdd at the reset time, and Vdd/2 at the read time. For example, when the selected memory cell MCa is accessed, it is necessary to supply 0 V to the bit line B2 in the case of a write operation. This 0 V to be supplied is generated by the access bit line potential supply driver K2.

The source driver K1P supplies a write potential, reset potential or read potential to a selected bit line via a potential line CDBK1P. The potential line CDBK1P is set at Vdd at the write time, Vdd at the reset time, and 0 V at the read time.

Figure 12A:
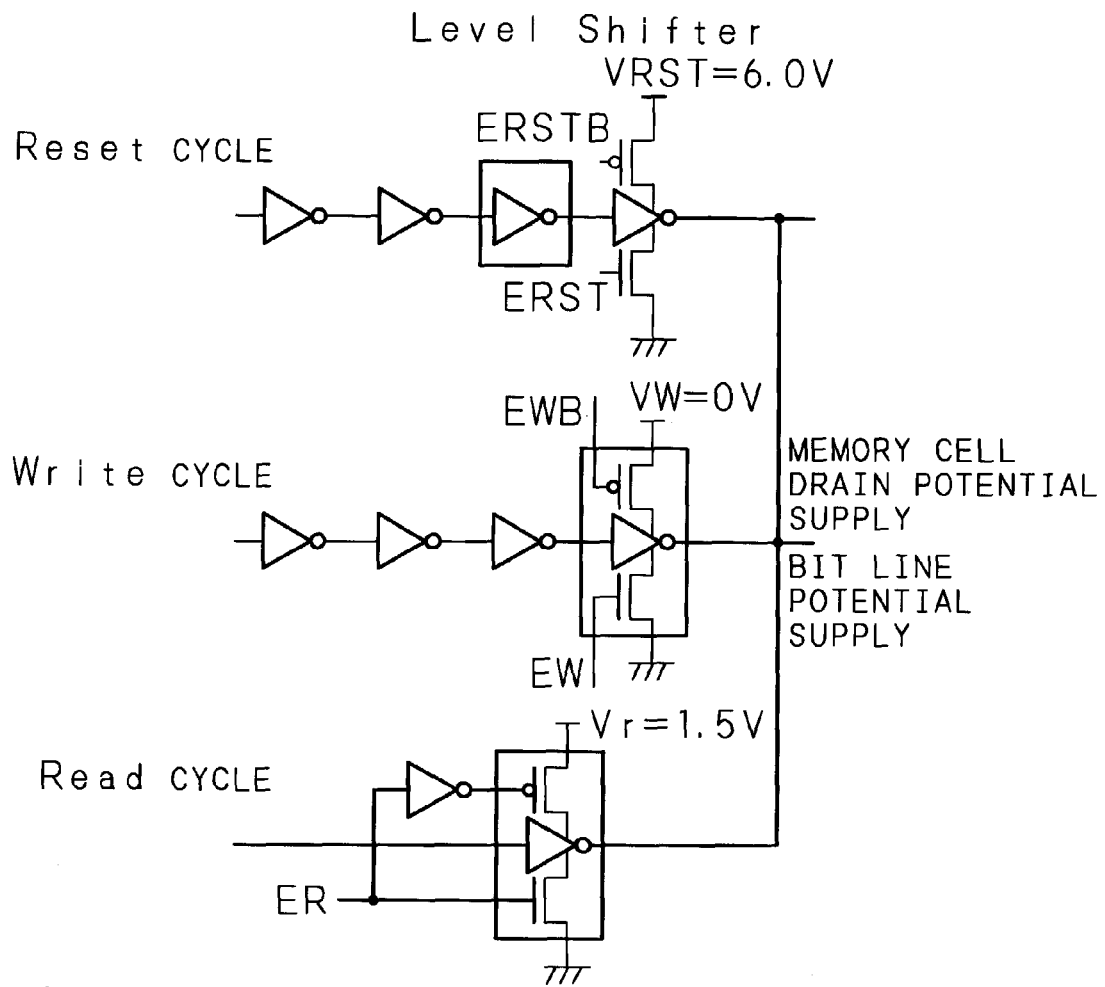
FIG. 12A is a circuit diagram showing an example of an access bit line potential supply driver.
Figure 12B:
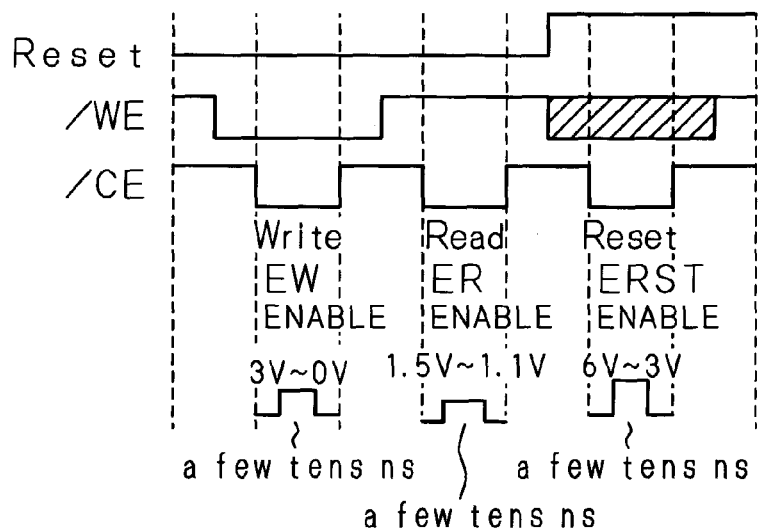
FIG. 12B is a timing chart of FIG. 12A.

FIG. 12A is a circuit diagram showing an example of the access bit line potential supply driver (access bit line driver K2). FIG. 12B is a timing chart of FIG. 12A. At the write operation time, as a Write cycle, the output of the access bit line driver is set at 0 V. At this time, the outputs of the reset-use and read-use drivers become floating. In other words, at the write operation time, as shown in the timing chart of FIG. 12B, a signal EW becomes High. Hence, a signal Ewd, obtained by delaying the signal EW shown in FIG. 12A, becomes High. Therefore, a write driver becomes ENABLE, and 0 V is supplied from the access bit line potential supply driver. At this time, a signal ER that becomes active at the read operation time and a signal ERST that becomes active at the reset operation time are Low as shown in the timing chart. In this case, a delayed signal ERSTd, obtained by delaying the ERST signal, is Low, and the ERSTdb signal is High, whereby the output of the reset driver becomes floating.

In addition, since the signal ER is Low, the output of the read driver becomes floating. Similarly, 6 V is supplied at the reset operation time, and the outputs of the write-use and read-use drivers become floating. Furthermore, just as in the case of the write operation, 0 V is supplied to the bit line of the selected cell at the read operation time, whereby the outputs of the write-use and reset-use drivers become floating.

Figure 13:
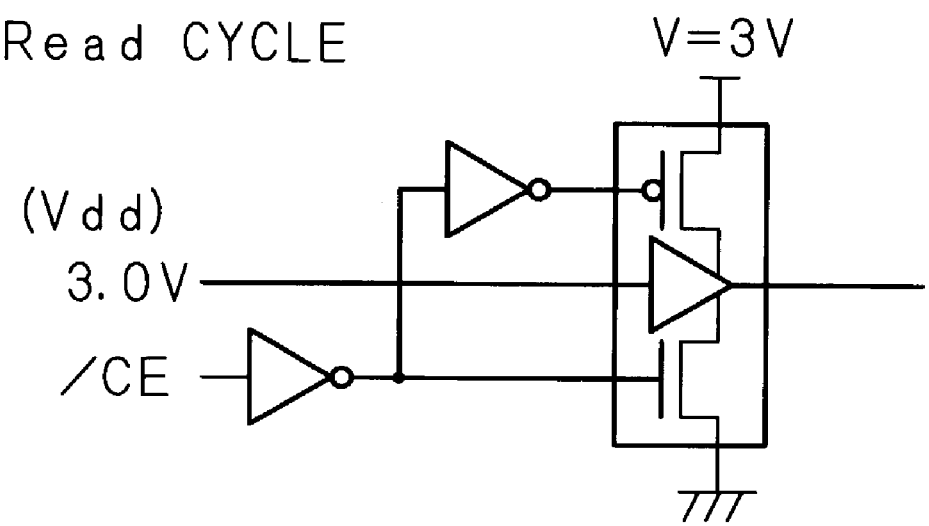
FIG. 13 is a circuit diagram showing examples of a source voltage application driver and a bit line potential supply driver.

FIG. 13 is a circuit diagram showing an example of the source voltage application driver and the bit line potential supply driver. The source voltage application driver (K1) supplies the potential Vdd to the source line connected to the selected memory cell MCa at the write time, the reset time and the read time. In addition, the driver (the bit line potential supply driver) supplies 3 V to all the non-selected bit lines at the write time, the reset time and the read time. In other words, the source voltage application driver is also used as the bit line potential supply driver.

Figure 14:
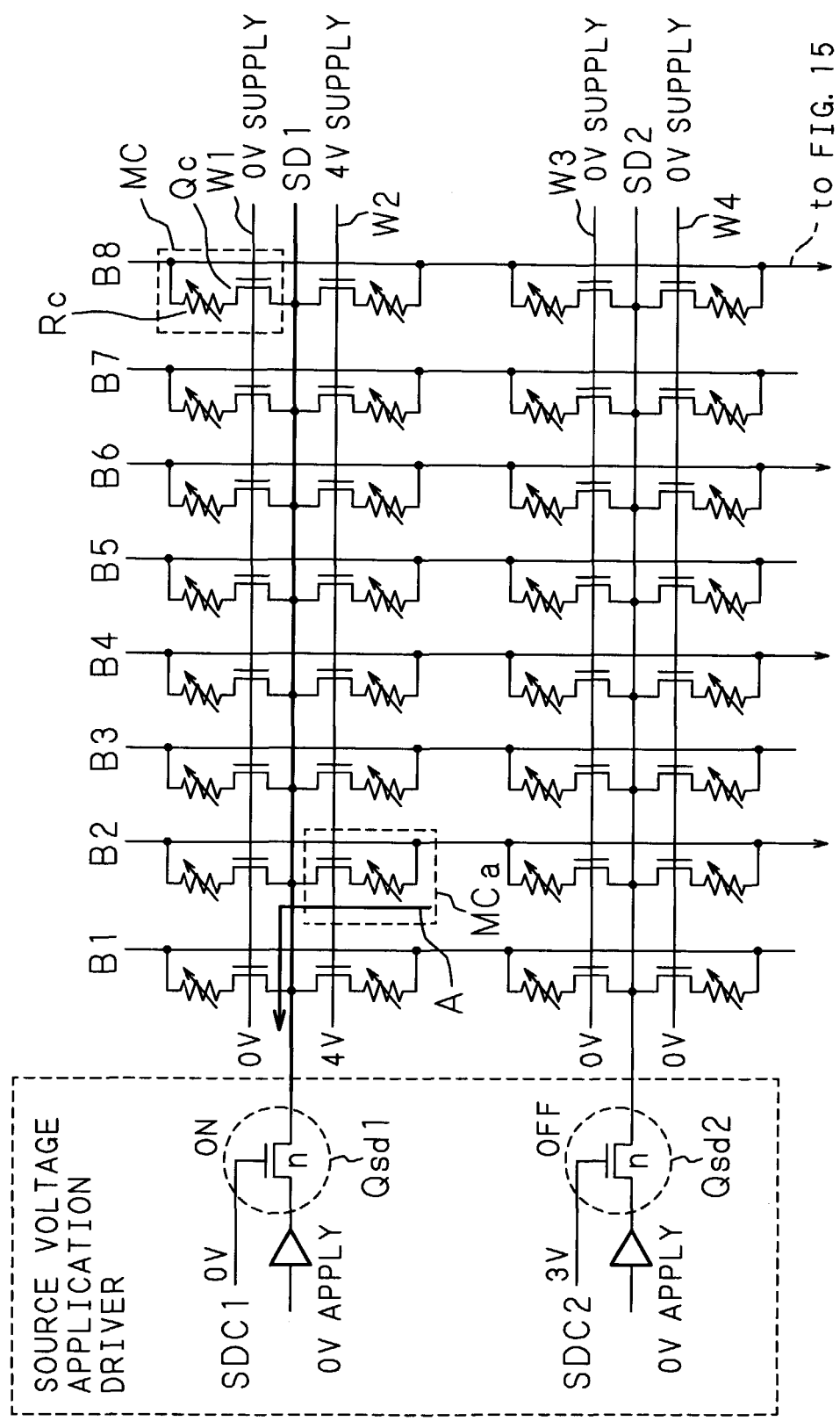
FIG. 14 is a circuit diagram illustrating another access method for the reset operation.
Figure 15:
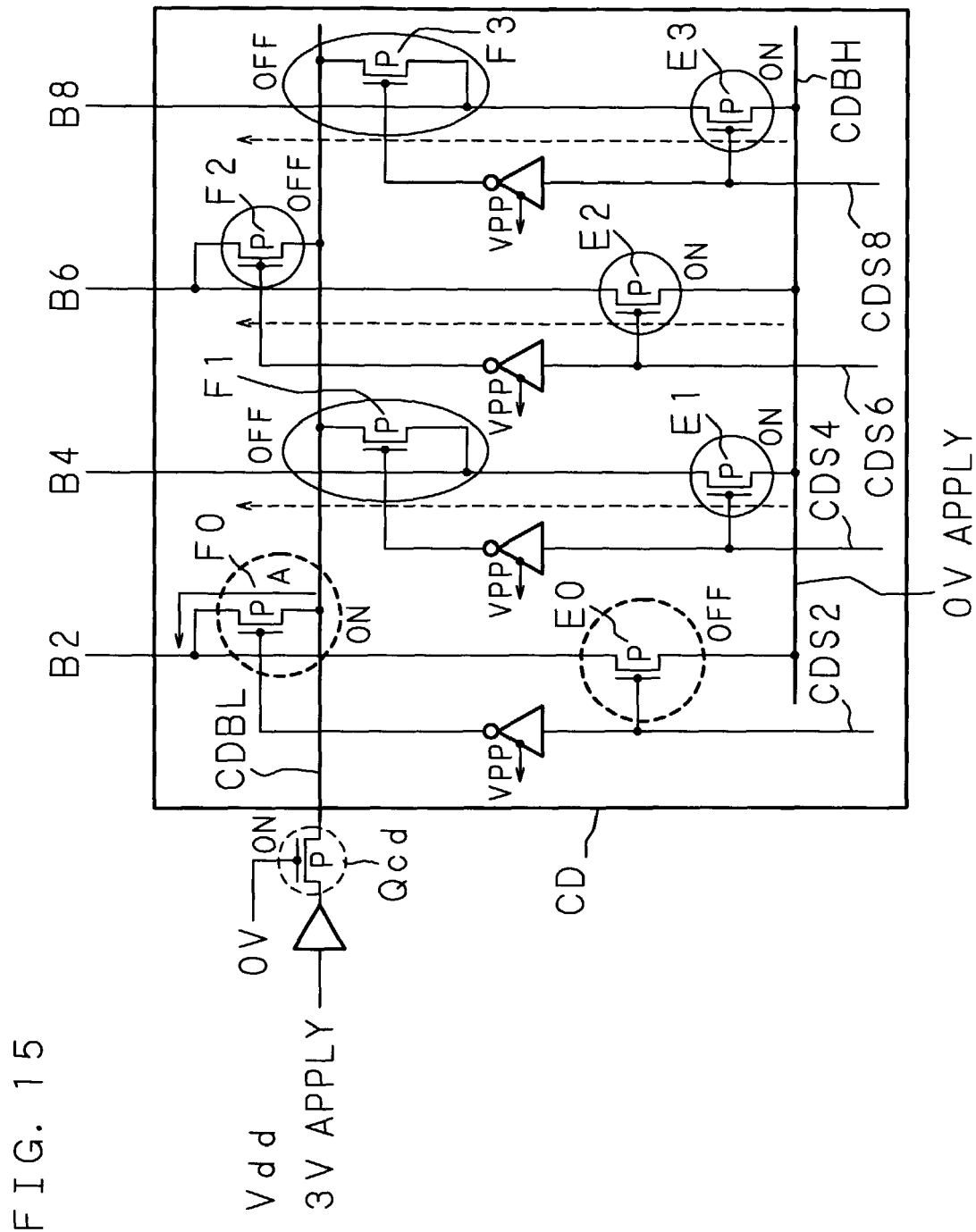
FIG. 15 is a circuit diagram illustrating another access method for the reset operation.

FIGS. 14 and 15 are circuit diagrams illustrating another access method for the reset operation. The circuit configurations are basically similar to those shown in FIGS. 2 to 11. The same components are designated by the same codes, and their detailed explanations are omitted.

(Explanation of Another Reset Operation)

To reset the resistance value of the variable resistor Rc in the selected memory cell MCa, Vdd (3 V) is applied to the bit line B2 connected to the variable resistor in the selected memory cell MCa. In addition, Vdd+$\Delta$V (3+1=4 V) is applied to the word line W2 connected to the gate of the Tr Qc in the selected memory cell MCa. At the other word lines W1, W3 and W4, the 0 V application state remaining after the inactive state is maintained. In addition, 0 V is applied to the source drive line SD1 connected to the source of the Tr Qc in the selected memory cell.

Furthermore, by applying 0 V to the non-selected bit lines B1 and B3 to B8, a countermeasure is taken so that no potential difference occurs across each of the variable resistors Rc in the non-selected memory cells. To carry out this countermeasure, 0 V of the potential line CDBH is applied to the bit lines B4, B6 and B8 (FIG. 15) by turning ON the Trs E1, E2 and E3 in the column decoder CD using the column address signals (lines) CDS4, CDS6 and CDS8 as explained in the above-mentioned resistance value reset operation. On the other hand, the Tr E0 connected to the bit line B2 connected to the selected memory cell MCa is turned OFF on the basis of the column address signal CDS2 which has been input, whereby the selected Tr F0 is turned ON. Hence, the potential of the bit line B2 is set at the potential Vdd of the potential line CDBL via the current path indicated by arrow A.

In this input condition, only one current path from the bit line B2 through the Tr Qc in the selected memory cell MCa to the source drive line SD1 is formed as indicated by arrow A. Hence, a voltage can be applied to the variable resistor Rc in the selected memory cell MCa, and the reset operation (the reduction of the resistance value) for the variable resistor Rc can be carried out. By applying Vdd from this bit line B2, the resistance value of the variable resistor Rc lowers to several hundred $\Omega$. By this series of operations, the reset operation for write data is carried out only in the selected memory cell MCa. In this case, a high voltage generating circuit (a boosting circuit) for supplying 2Vdd can be omitted, in comparison with the embodiment of the above-mentioned reset operation. The read method is similar to the above-mentioned method.

Figure 16:
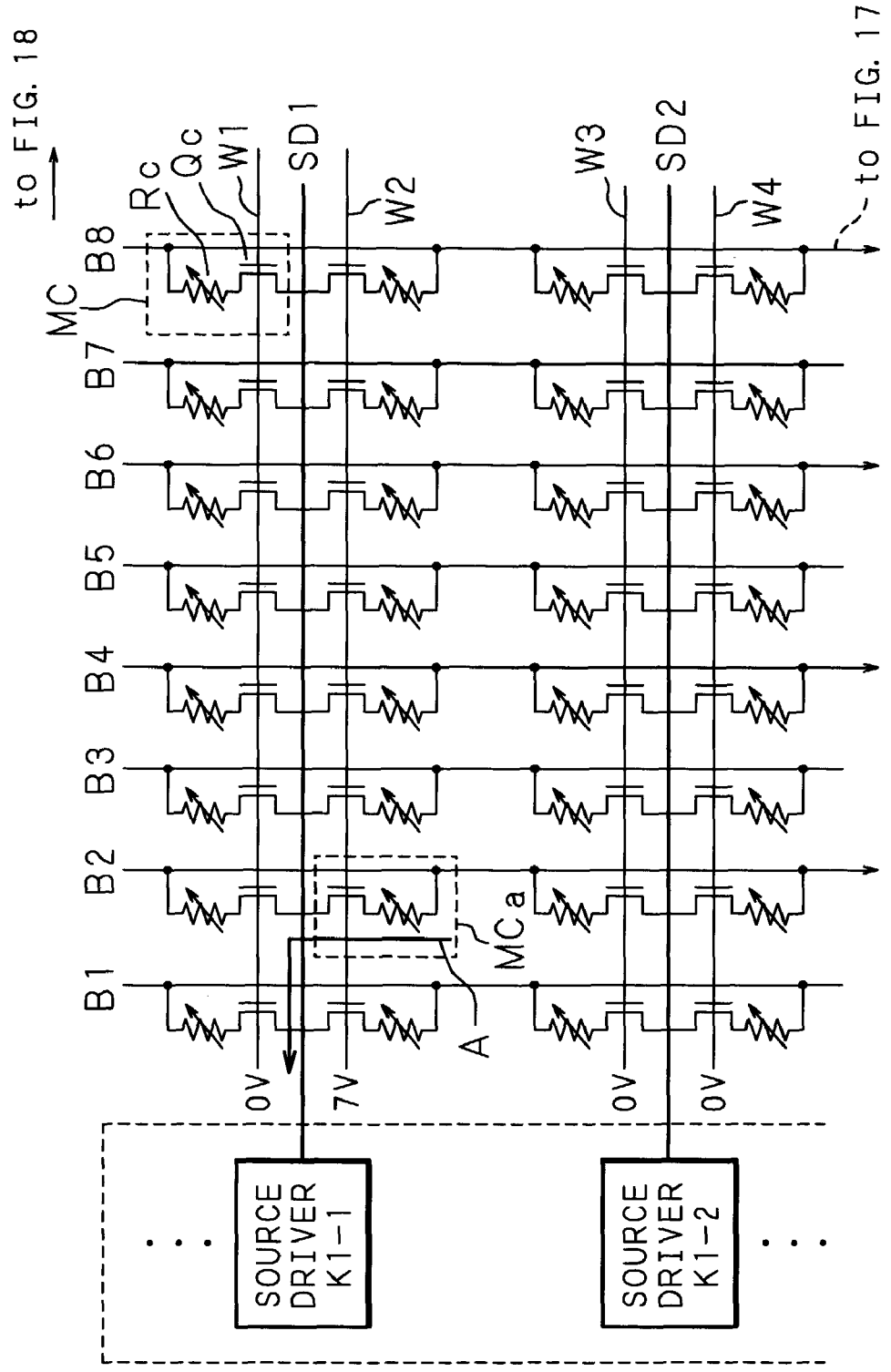
FIG. 16 is a block diagram showing the write, reset and read operations.
Figure 17:
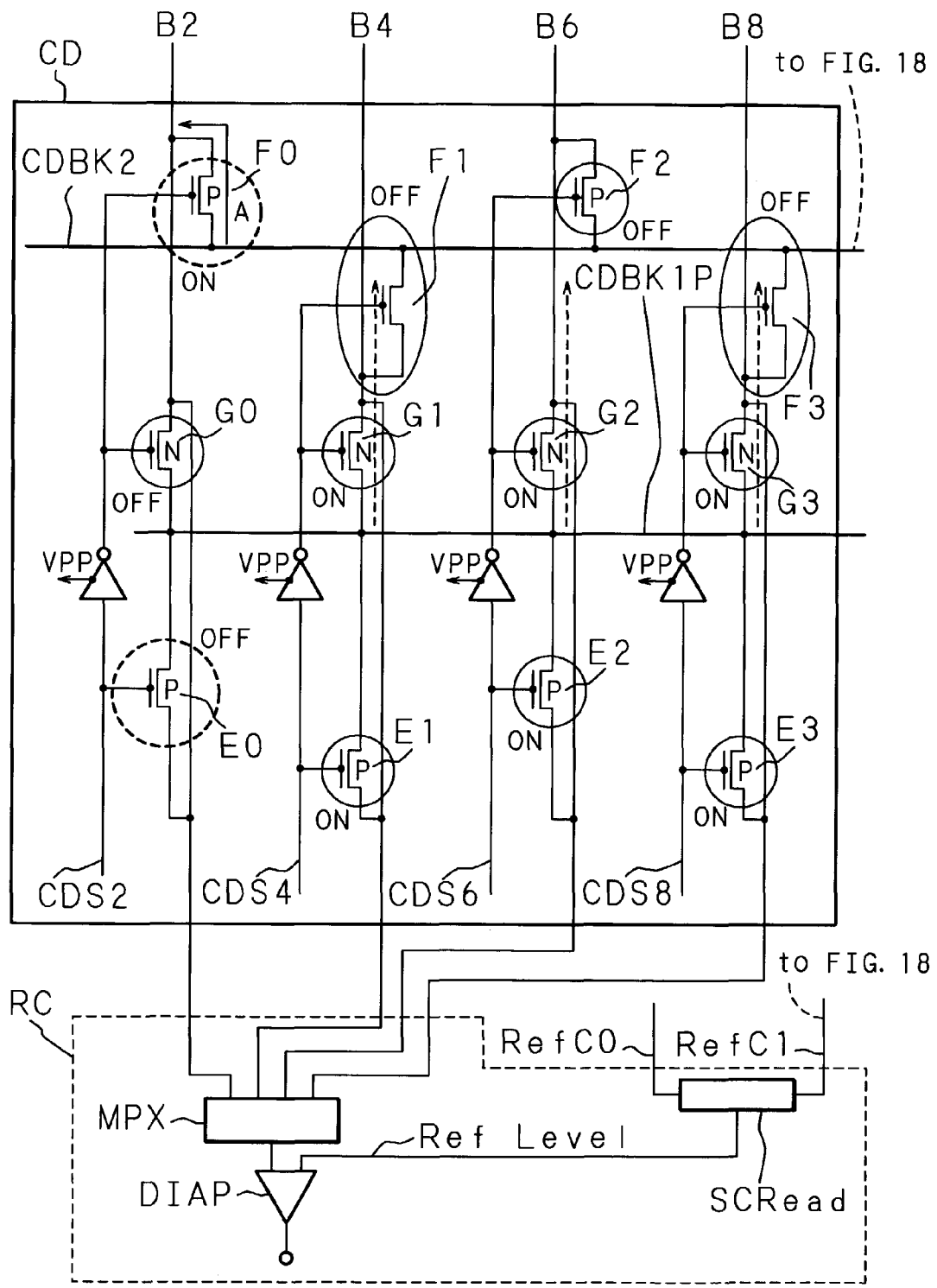
FIG. 17 is a block diagram showing the write, reset and read operations.
Figure 18:
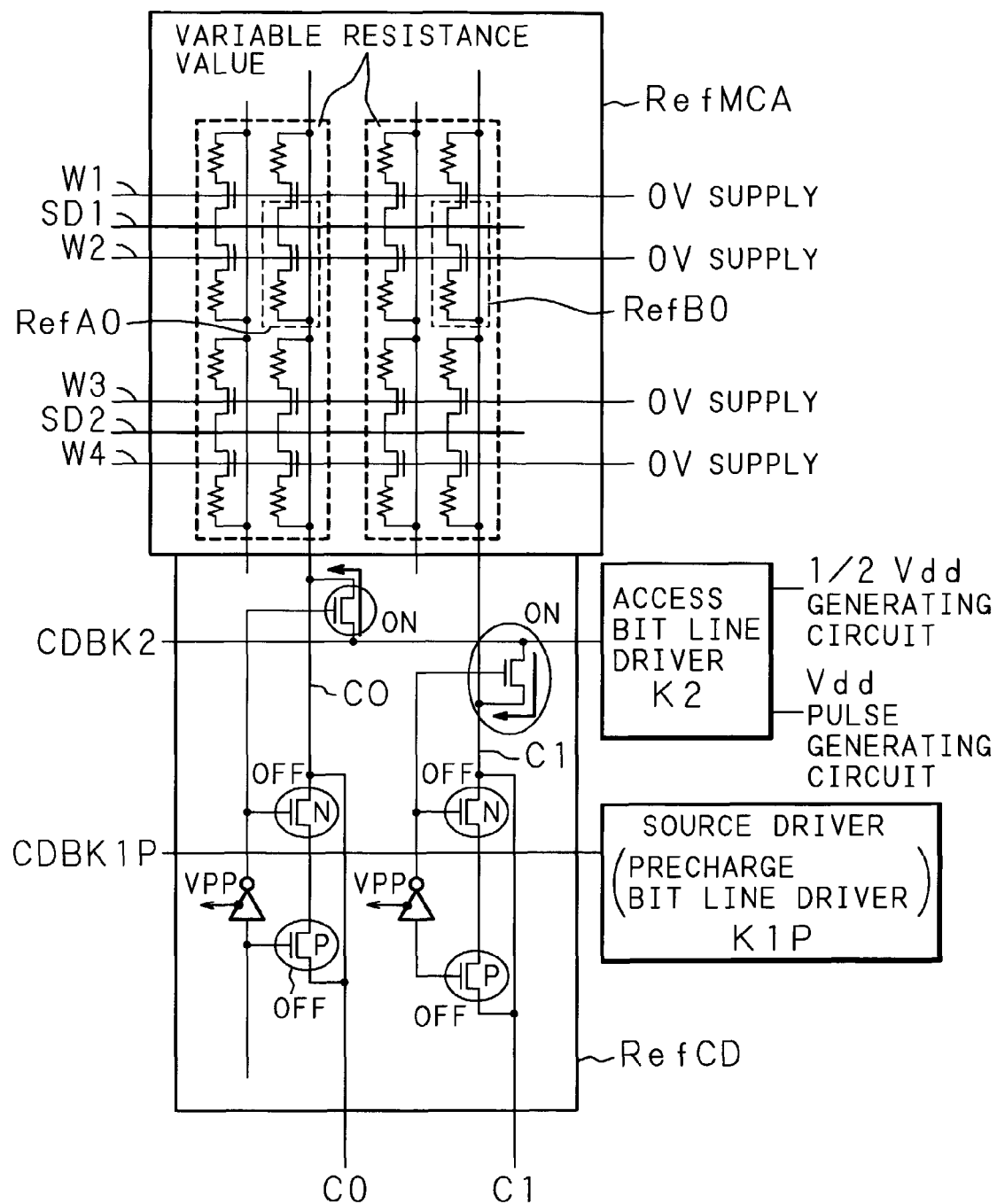
FIG. 18 is a block diagram showing the write, reset and read operations.

FIGS. 16, 17 and 18 are block diagrams showing write, reset and read operations. FIG. 16 shows source drivers K1 (K1-1, K1-2) and a memory array. FIG. 17 shows a column decoder CD and a readout circuit RC. FIG. 18 shows a Ref-use memory cell array RefMCA, a Ref-use column decoder RefCD, an access bit line potential supply driver K2 (an access bit line driver K2) and a source driver (a precharge bit line driver) K1P. The circuit configurations are basically similar to those shown in FIGS. 2 to 11 and 14 and 15. The same components are designated by the same codes, and their detailed explanations are omitted.

The source drivers K1-1 and K1-2 drive the source drive lines SD1 and SD2, respectively. The source drive lines SD1 and SD2 are set at Vdd at the write time, 0 V at the reset time, and 0 V at the read time.

The access bit line potential supply driver K2 supplies a write potential, reset potential or read potential to a selected bit line (for example, the bit line B2) via a potential line CDBK2. The potential line CDBK2 is set at 0 V at the write time, Vdd at the reset time, and Vdd/2 at the read time.

The source driver K1P supplies a write potential, reset potential or read potential to a selected bit line (for example, the bit line B2) via a potential line CDBK1P. The potential line CDBK1P is set at Vdd at the write time, 0 V at the reset time, and 0 V at the read time.

Figure 19:
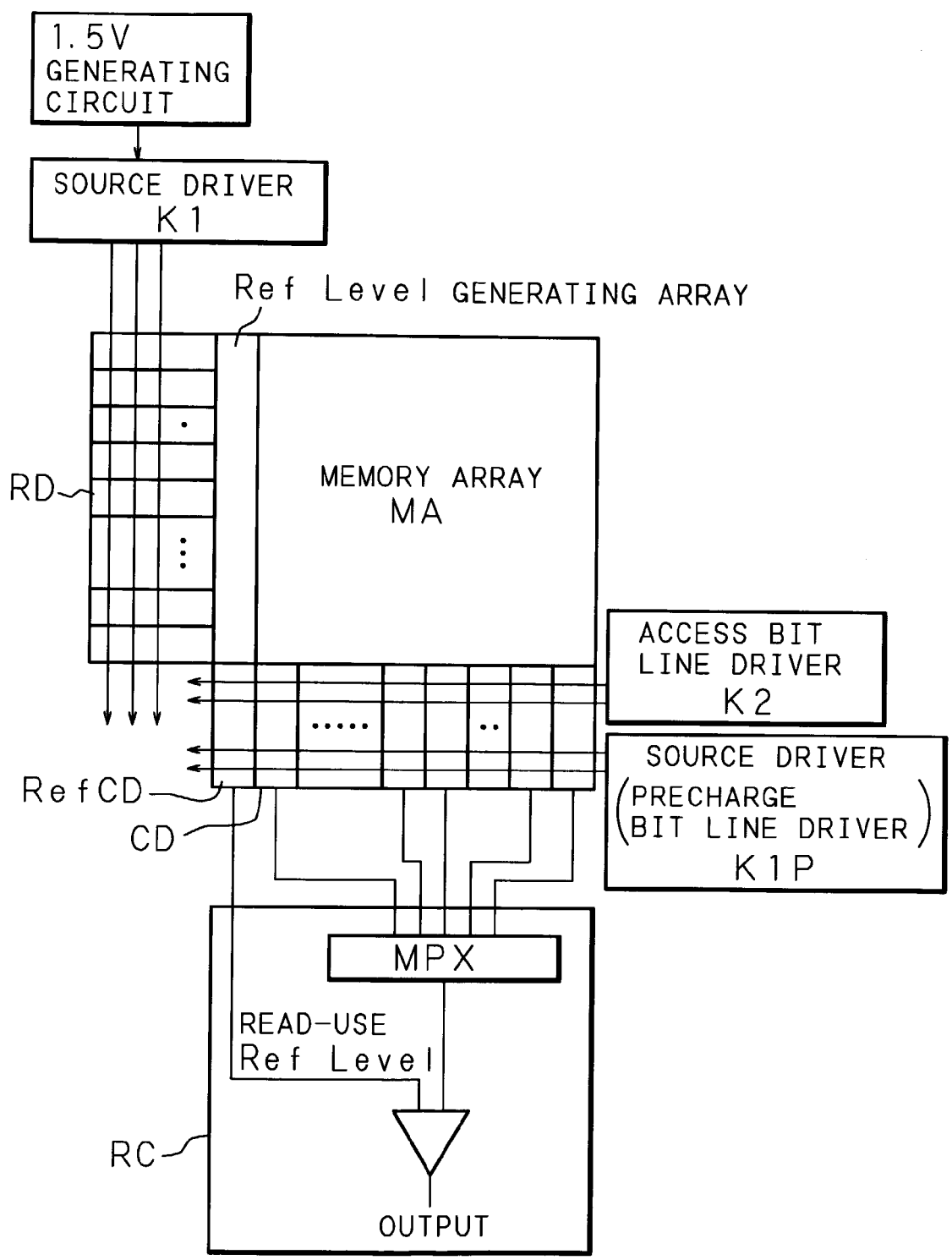
FIG. 19 is a block diagram showing the placement of peripheral circuits of the memory cells in accordance with the present invention.

FIG. 19 is a block diagram showing the placement of memory cell peripheral circuits in accordance with the present invention. The peripheral circuits are arranged around a memory array MA having 1T1R type memory cells arranged in a matrix. The peripheral circuits comprise a row decoder RD for applying potentials to the source drive lines (SD1 and the like) of the memory array MA, a column decoder CD for applying potentials to the bit lines (B1 and the like), and a readout circuit RC for outputting the outputs of the column decoder CD via a multiplexer MPX and a differential amplifier DIAP in which a read-use Ref Level is used as a reference signal. Therefore a memory device does not require a boosting circuit. A Ref level generating array and a source driver K1 are connected to the row decoder RD. A 1.5 V generating circuit, for example, is connected to the source driver K1. An access bit line potential supply driver K2 (access bit line driver K2), a source driver (precharge bit line driver) K1P and a Ref-use column decoder RefCD are connected to the column decoder CD.

Figure 20:
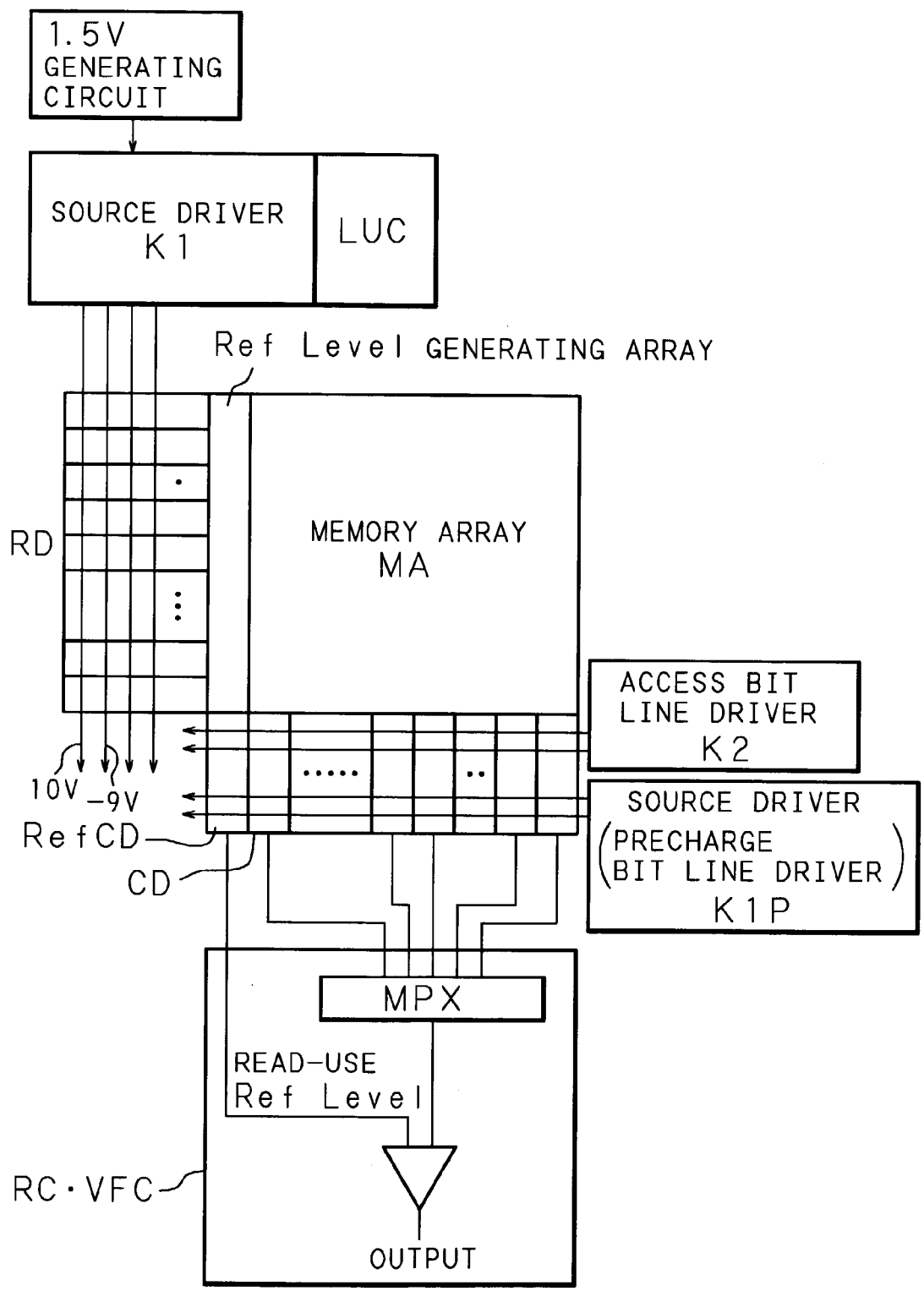
FIG. 20 is a block diagram showing the placement peripheral circuits for a flash memory shown for comparison.

FIG. 20 is a block diagram showing the placement of flash memory peripheral circuits shown for comparison. This block diagram shows an example of a conventional technology wherein a boosting circuit LUC and a verify circuit VFC required for a flash memory are added. In the conventional flash memory, it is necessary to apply a high voltage of about 10 V to the gate electrode of a memory cell at a write operation time. In addition, at a write data erase (reset) operation time, it is necessary to supply a negative voltage of about −9 V to the gate electrode of the memory cell. Hence, in the block diagram shown in FIG. 20, it is necessary to provide the boosting circuit LUC for the source driver K1 thereby to supply about 10 V at the write operation time and to supply about −9 V at the erase operation time.

In comparison with the conventional technology, the 1T1R type memory cell in accordance with the present invention, comprising a variable resistor having a resistance body of a perovskite structure, can carry out write, reset and read operations at a low power source voltage of about 2 to 5 V. Hence, the boosting circuit LUC required conventionally can be eliminated as shown in FIG. 19, whereby the peripheral circuits can be simplified and low power consumption can be attained. Furthermore, the 1T1R type memory cell having the perovskite structure in accordance with the present invention requires no verify operation, whereby the verify circuit VFC is not necessary as shown in FIG. 19.

In the conventional flash memory, in order to make a judgment as to whether a desired threshold voltage is written in a selected memory cell after a write operation, it is necessary to read the data of the selected memory cell by using the readout circuit and to make a judgment as to whether correct data is written (a verify operation). Therefore, it is always necessary to carry out the verify operation after the write operation, whereby the write operation becomes extremely slow. If the write data is found improper after the verify operation, it is necessary to carry out the write operation and the verify operation again.

However, the 1T1R type memory cell in accordance with the present invention, wherein a variable resistor having a resistance body of a perovskite structure is used as a memory element, the resistance value in the memory cell is changed by 1 cycle of a write or reset operation, and a stable change can be attained, whereby no verify operation is required. In other words, the sequence of the write and reset operation can be simplified by the amount for the verify operation.

[Embodiment 2]

Figure 21A:
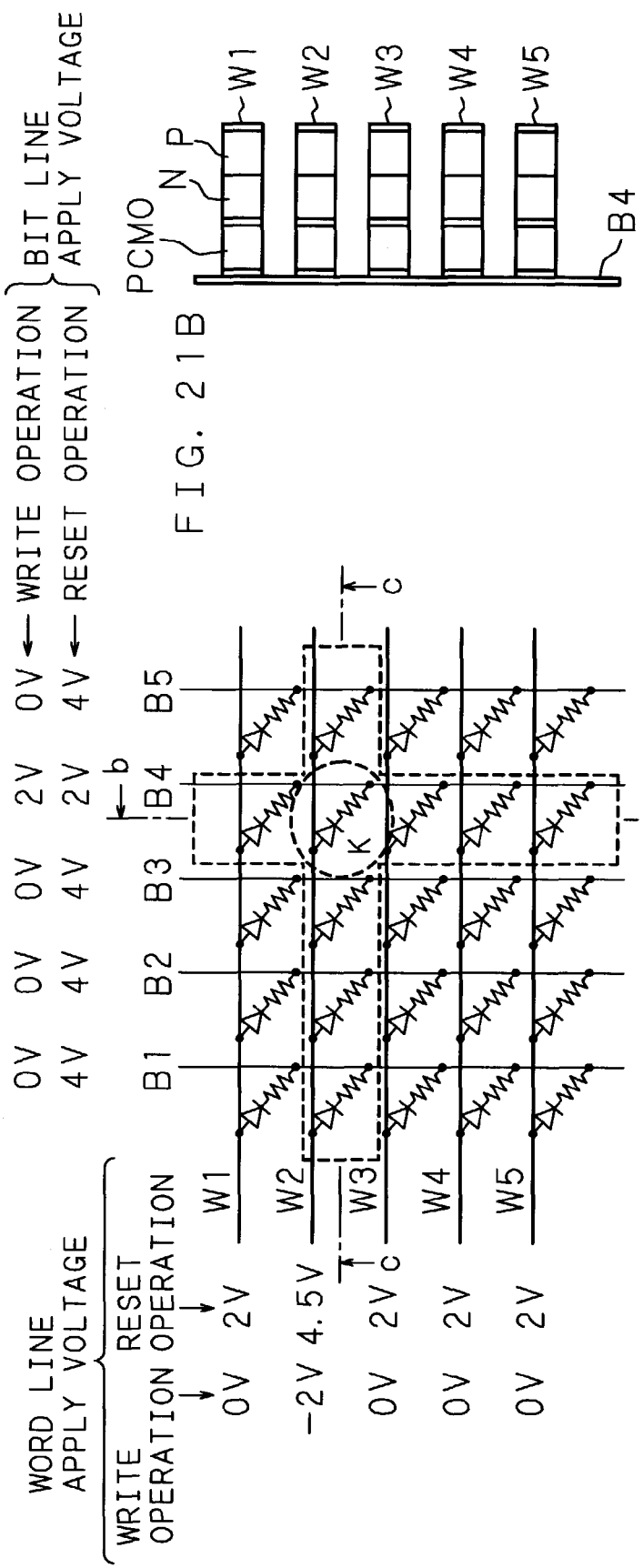
FIG. 21A is a schematic plan view (circuit diagram) showing a memory array in accordance with the present invention.
Figure 21B:
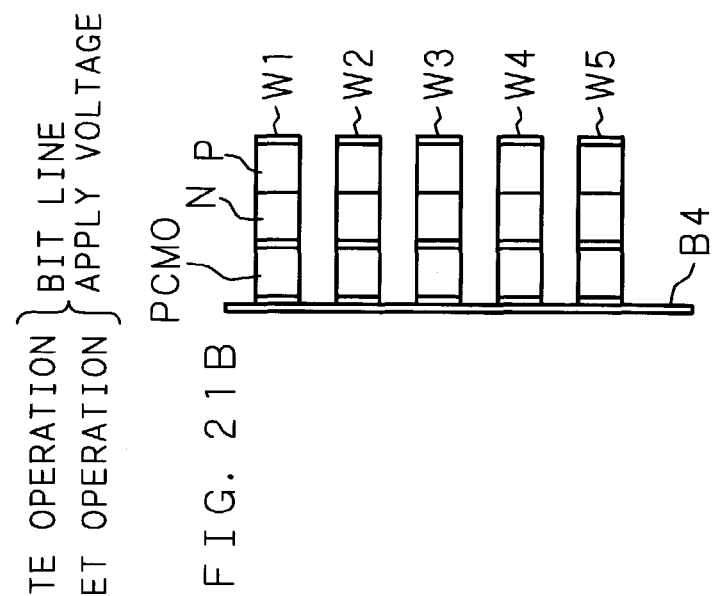
FIG. 21B is a schematic sectional view taken on arrow bb of FIG. 21A.
Figure 21C:
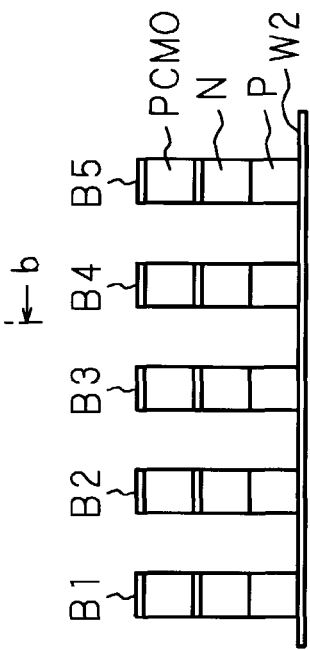
FIG. 21C is a schematic sectional view taken on arrow cc of FIG. 21A.

In a memory cell in accordance with Embodiment 2, a variable resistor having a resistance body made of a thin-film material PCMO or the like is used as a memory element, and a PN junction diode (hereafter referred to as a diode) is used instead of the FET in accordance with Embodiment 1. FIGS. 21A to 21C are views illustrating the configuration of a memory device (memory array) in accordance with the present invention. FIG. 21A is a schematic plan view (circuit diagram) showing a memory array in accordance with the present invention. FIG. 21B is a schematic sectional view taken on arrow bb of FIG. 21A. FIG. 21C is a schematic sectional view taken on arrow cc of FIG. 21A. The memory cell (and a memory array) is formed by using of a variable resistor as a memory element. The variable resistor has a resistance body made of a thin-film CMR material (for example, PCMO).

By forming memory cells, each comprising a diode and a variable resistor, at the intersections of word lines W1 to W5 and bit lines B1 to B5, significant miniaturization can be attained. The anodes of the diodes are connected in common to the word lines W1 to W5 in the row direction. The cathodes of the diodes are each connected to one terminal of each of the variable resistors, and the other terminals of the variable resistors are connected in common to the bit lines B1 to B5 in the column direction. By the above-mentioned connections, a memory array is formed. In the figure, the memory cell at the intersection (a width is indicated by broken lines overlaid on solid lines) of the word line W2 and the bit line B4 is shown as an accessed memory cell K. In this case, 5×5=25 memory cells are formed. Since this memory cell is a combination of one diode and one variable resistor, it is referred to as a 1D1R type memory cell. In addition, the values of the voltages applied to the word lines W1 to W5 and the bit lines B1 to B5 at the write operation time and the reset operation time are indicated for reference.

The word lines W1 to W5 and the bit lines B1 to B5 are usually formed of polycrystal silicon. In FIG. 21B, a current path from each of the word lines W1 to W5 through the PN junction of each diode and a variable resistor formed of PCMO to the bit line B4 is formed. In FIG. 21C, a current path from the word line W2 through the PN junction of each diode and a variable resistor formed of PCMO to each of the bit lines B1 to B5 is formed. Contact metal layers are formed at the connection portions of the PCMO films and the bit lines B 1 to B5 and the connection portions of the PCMO films and the diodes. For example, platinum (Pt), iridium, etc. can be used for the contact metal layers.

The operation method of the memory array formed as described above will be described below.

(Write Operation)

Figure 22:
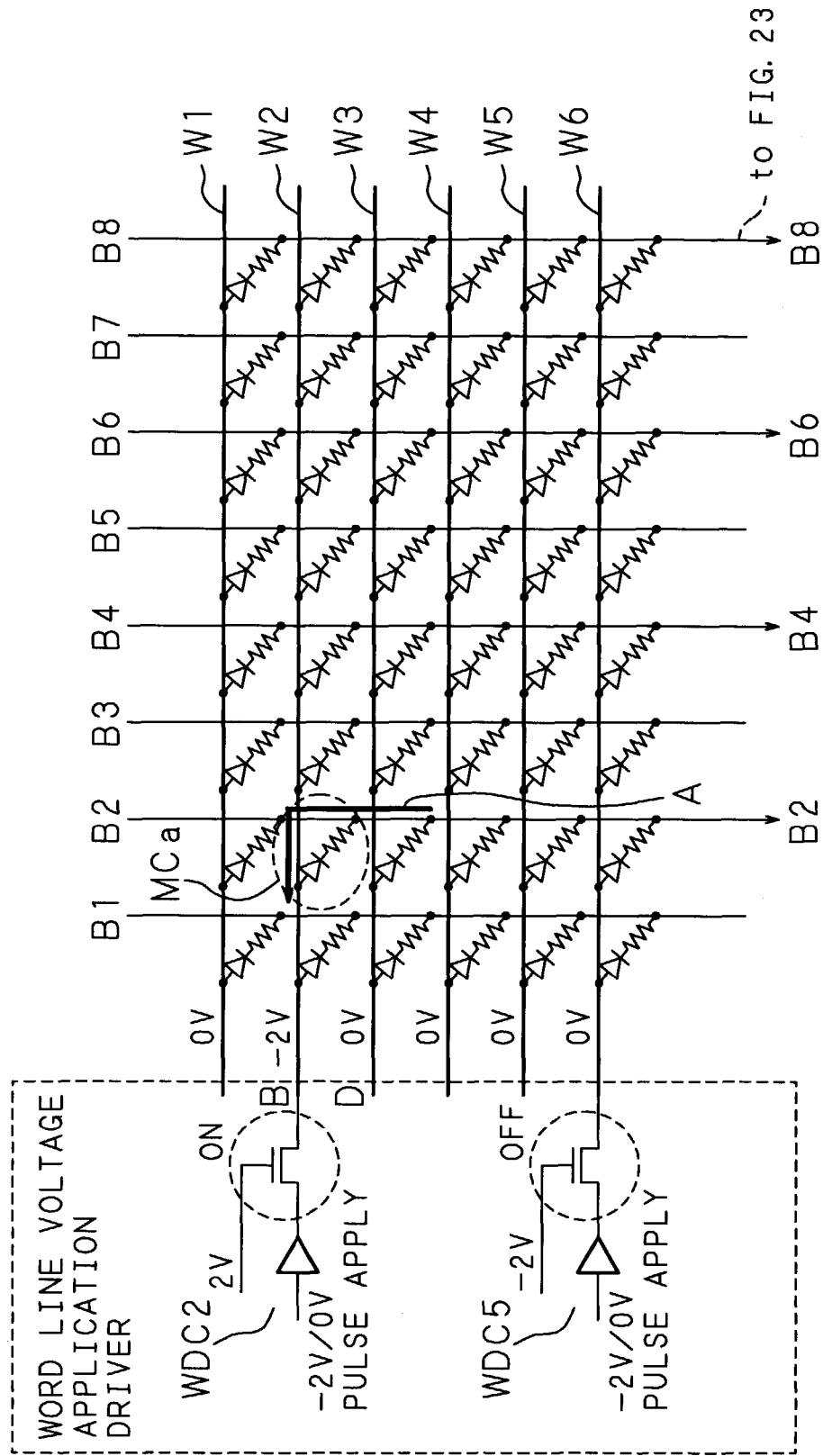
FIG. 22 is a circuit diagram illustrating a write operation for a memory cell in accordance with the present invention.
Figure 23:
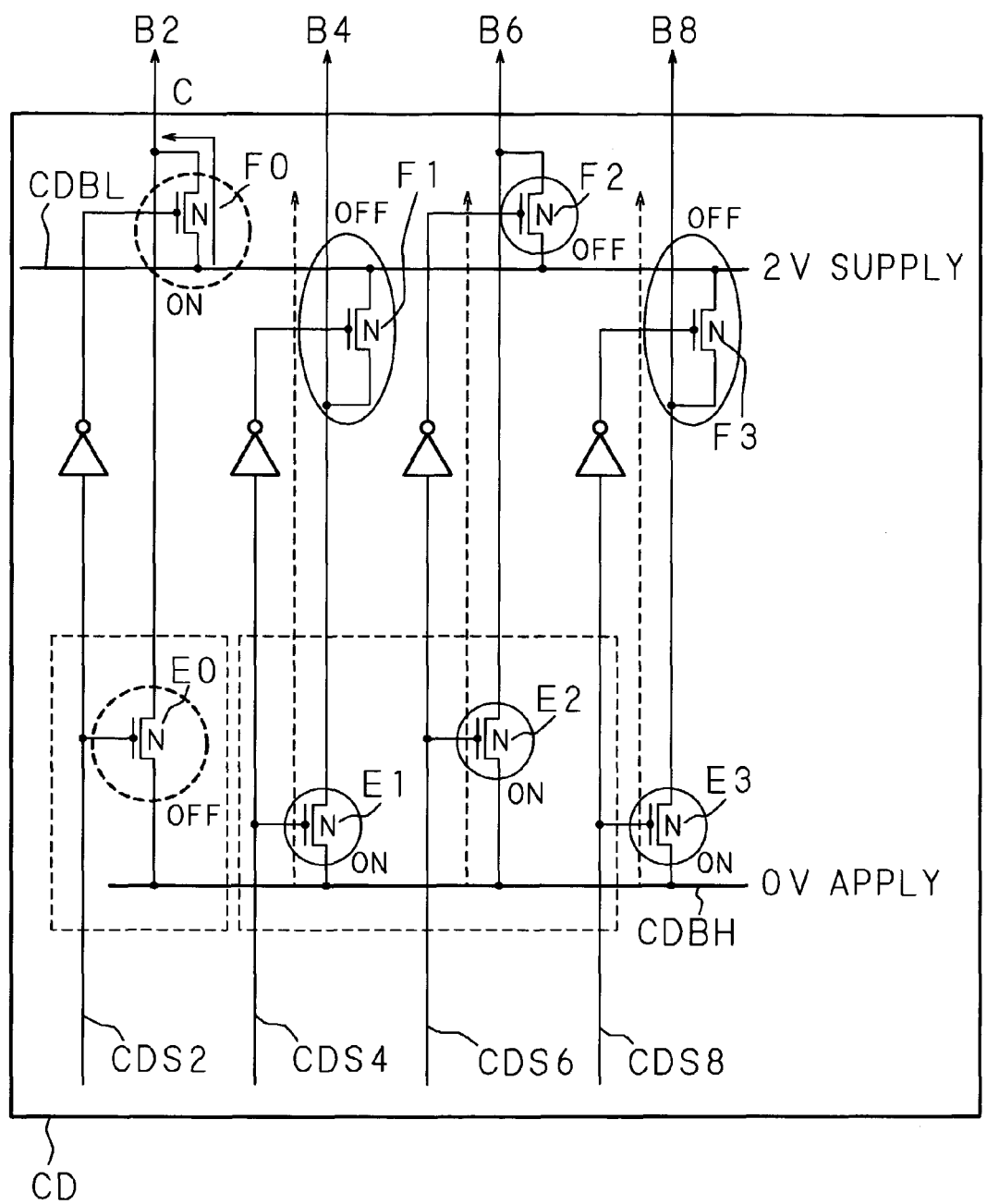
FIG. 23 is a circuit diagram illustrating a write operation for the memory cell in accordance with the present invention.

FIGS. 22 and 23 are circuit diagrams illustrating a write operation for a memory cell in accordance with the present invention. The write operation for the variable resistor in accordance with the present invention can be carried out by applying 2 V across the terminals of the variable resistor.

Furthermore, a case wherein a memory array comprising diodes each having a reverse breakdown voltage of 2 V is used is described below. When this memory array is inactive (in a precharge state), 0 V is applied to all the bit lines B 1 to B8, and 0 V is also applied to all the word lines W1 to W6. In order to carry out a write operation for a selected memory cell MCa (in order to raise the resistance value of the variable resistor in the selected memory cell MCa), 2 V is applied to the bit line B2 connected to the variable resistor in the selected memory cell MCa, and 0 V is applied to the other bit lines B1 and B3 to B8. In addition, −2 V is applied to the word line W2 connected to the diode in the selected memory cell MCa, and 0 V is applied to the other word lines W1 and W3 to W6. The potentials of the word lines W1 to W6 are determined by word line voltage application drivers WDC1 to WDC6 (shown partially).

In this input condition, as shown in FIG. 22, only one current path from the bit line B2 through the variable resistor and the diode (a reverse voltage is applied) in the selected memory cell MCa to a word line voltage application driver WDC2 is formed as indicated by arrow A, whereby a voltage can be applied to the variable resistor in the selected memory cell MCa and the write operation can be carried out at the variable resistor (the variable resistance value in the memory cell is raised).

Furthermore, in this condition, 2 V is applied from the bit line B2 connected to the selected memory cell MCa, and −2 V is applied to the word line W2 connected to the selected memory cell, whereby the variable resistance value rises to about 1 MΩ. By this series of operations, the write operation is carried out only for the selected memory cell.

Moreover, considerations must be given so that the resistance values of the variable resistors other than the variable resistor in the selected memory cell MCa are not changed and so that no potential difference occurs between each of the variable resistors other than the variable resistor in the selected memory cell MCa.

Hence, by turned ON all the Trs E1, E2 and E3 (in the column decoder CD shown in FIG. 23), 0 V can be applied to the non-selected bit lines B4, B6 and B8 (FIG. 23). In addition, only the Tr E0 for selecting the bit line B2 connected to the selected memory cell MCa is turned OFF on the basis of the column address signals (lines) CDS2, CDS4, CDS6 and CDS8 which have been input, whereby the Tr F0 for supplying 2 V to the bit line B2 (C) is turned ON. The other 2 V supplying Trs F1, F2 and F3 are turned OFF, whereby 2 V is not supplied to the other bit lines B4, B6 and B8. As a result, a potential difference of 4 V is generated across the selected memory cell MCa. However, since the reverse breakdown voltage of the diode is herein assumed to be 2 V, 2 V is supplied across the terminals of the variable resistor in the selected memory cell MCa. In this condition, the variable resistance value rises to about 1 MΩ.

The Trs E0, E1, E2, E3, F0, F1, F2 and F3 are controlled by the column address signals (lines) CDS2, CDS4, CDS6 and CDS8 in exactly the same way as in the case of Embodiment 1, and the detailed explanation thereof is omitted.

(Reset Operation)

Figure 24:
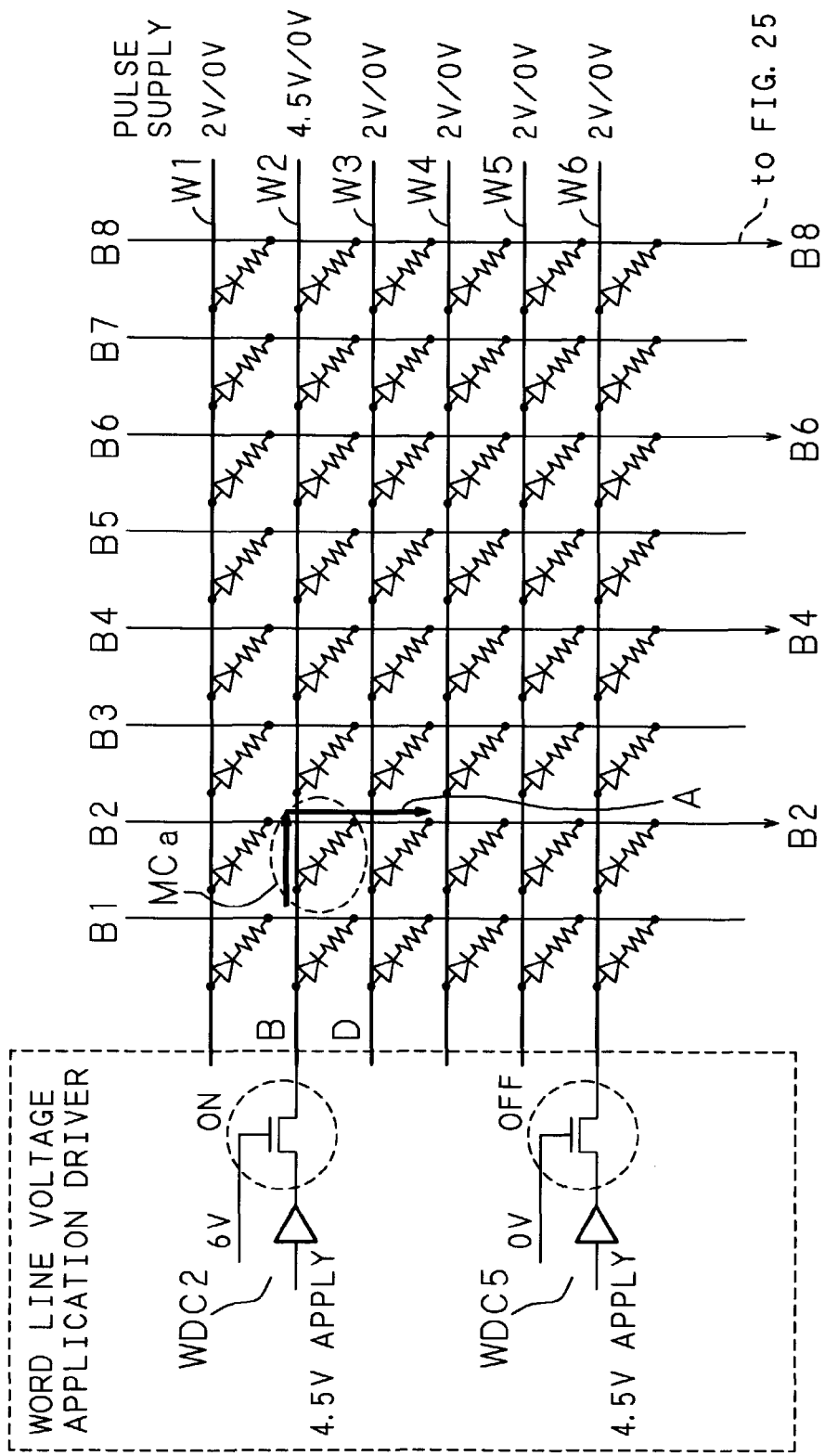
FIG. 24 is a circuit diagram illustrating a reset operation for a memory cell in accordance with the present invention.
Figure 25:
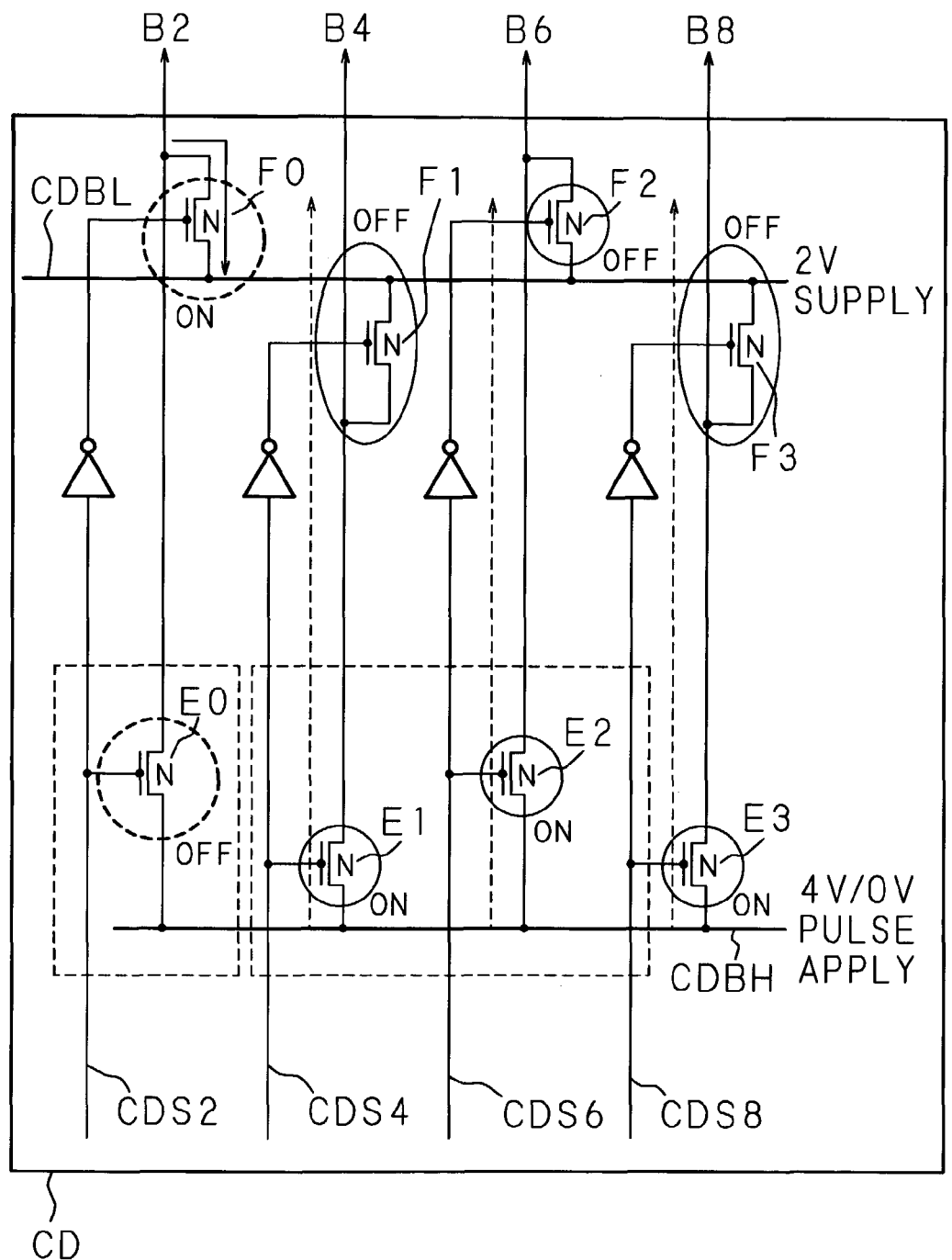
FIG. 25 is a circuit diagram illustrating a reset operation for the memory cell in accordance with the present invention.

FIGS. 24 and 25 are circuit diagrams illustrating a reset operation for a memory cell in accordance with the present invention. To reset the resistance value of the variable resistor in the selected memory cell MCa, 4.5 V is applied to the word line W2 connected to the diode in the selected memory cell MCa. In addition, 2 V is applied to the non-selected other word lines W1, W3 to W6. The voltage application to the word lines W1 to W6 is carried out by word line voltage application drivers WDC1 to WDC6 (partially shown). The 2 V application state is maintained at the bit line B2 connected to the variable resistor in the selected memory cell MCa. By applying 4 V to the other bit lines B1 and B3 to B8, a potential difference of 2V is generated in the diodes in the non-selected memory cells MC in the reverse direction. However, since the reverse breakdown voltage is 2 V or more, no current flows. As explained in the resistance value reset operation described above, when the Tr E1, E2 and E3 in the column decoder CD are turned ON, 4 V is supplied to the bit lines B4, B6 and B8 (FIG. 25) other than the selected bit line B2. In addition, only the Tr E0 for selecting the bit line B2 connected to the selected memory cell MCa is turned OFF on the basis of the column address signals (lines) CDS2, CDS4, CDS6 and CDS8 which have been input, whereby the Tr F0 for supplying 2 V to the bit line B2 is turned ON.

In this input condition, only one current path from the word line W2 through the diode and the variable resistor in the selected memory cell MCa to the bit line B2 is formed as indicated by arrow A, whereby a potential difference of 2 V or more can be generated across the terminals of the variable resistor in the memory cell MCa and the reset operation (the reduction of the resistance value) for the variable resistor can be carried out. By applying 4.5 V from this word line W2, a potential difference of about 2 V (about 2 V is obtained by subtracting the Vf amount of the forward voltage) is generated across the terminals of the variable resistor. Hence, the resistance value of the variable resistor lowers to several hundred Ω. By this series of operations, the reset operation for write data is carried out only in the selected memory cell MCa.

In the case when the variable resistance value is relatively large at first, the variable resistance value is lowered when the above-mentioned write operation is carried out for the first time. In addition, in the case when the variable resistance value is relatively small, the variable resistance value is raised when the above-mentioned reset operation is carried out for the first time. In this way, the variable resistance value is raised or lowered depending on the initial magnitude of the variable resistance value. In other words, when the variable resistance value is large at first, the variable resistance value is lowered when the operation carried out first is either of the above-mentioned write and reset operations. In addition, when the variable resistance value is small at first, the variable resistance value is raised when the operation carried out first is either of the above-mentioned write and reset operations.

(Read Operation)

Figure 26:
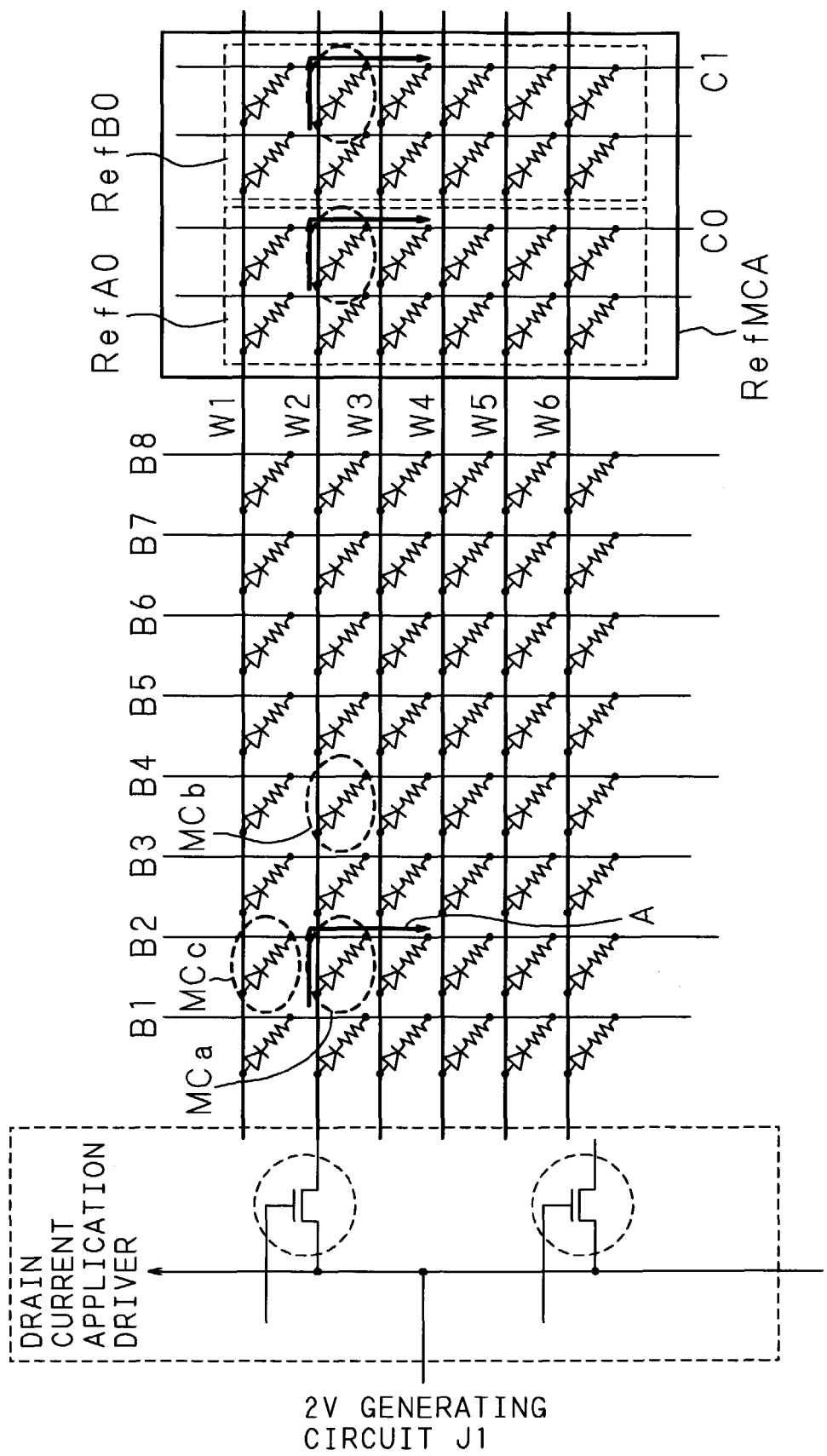
FIG. 26 is a circuit diagram illustrating a read operation for a memory cell in accordance with the present invention.
Figure 27:
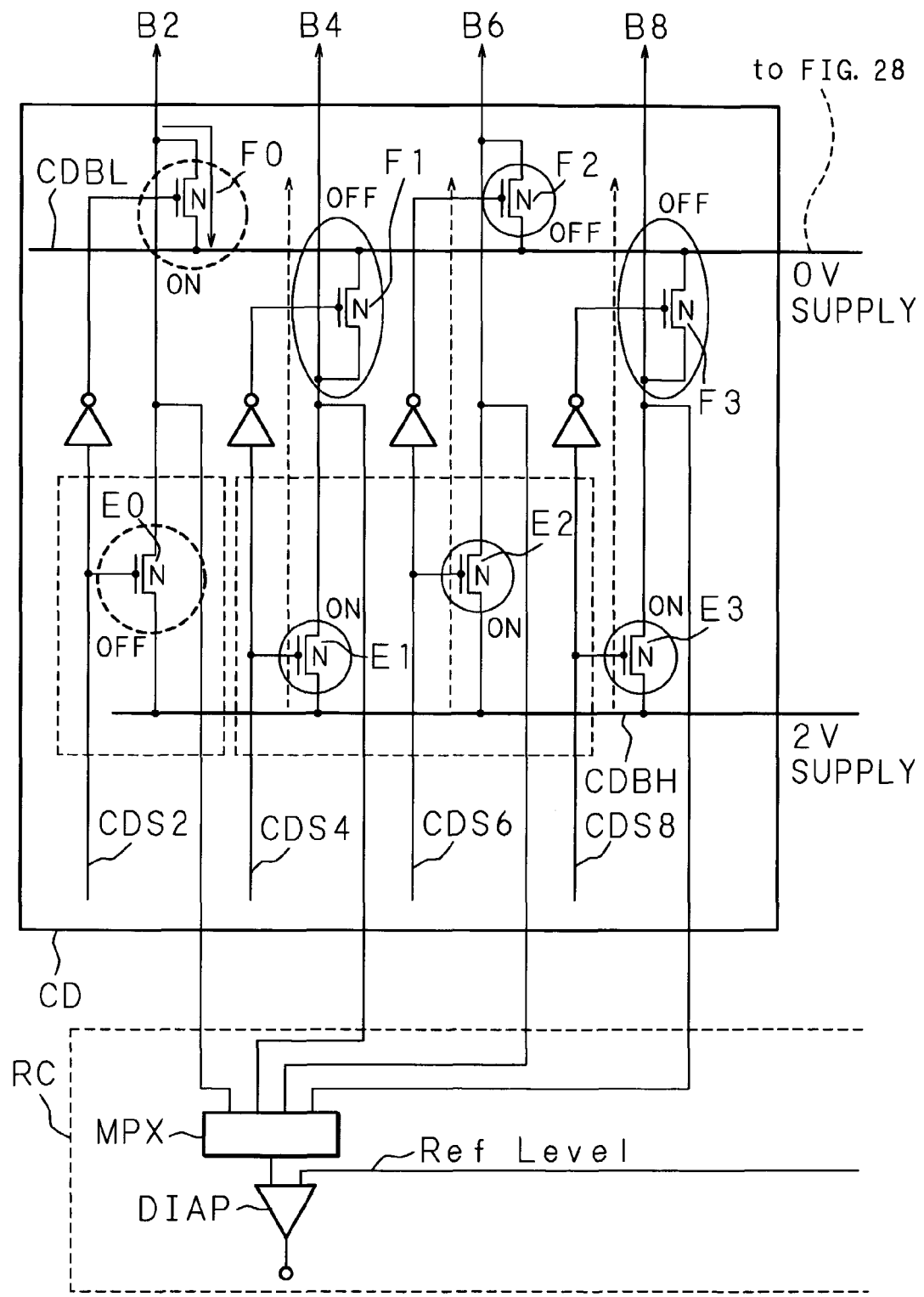
FIG. 27 is a circuit diagram illustrating a read operation for the memory cell in accordance with the present invention.
Figure 28:
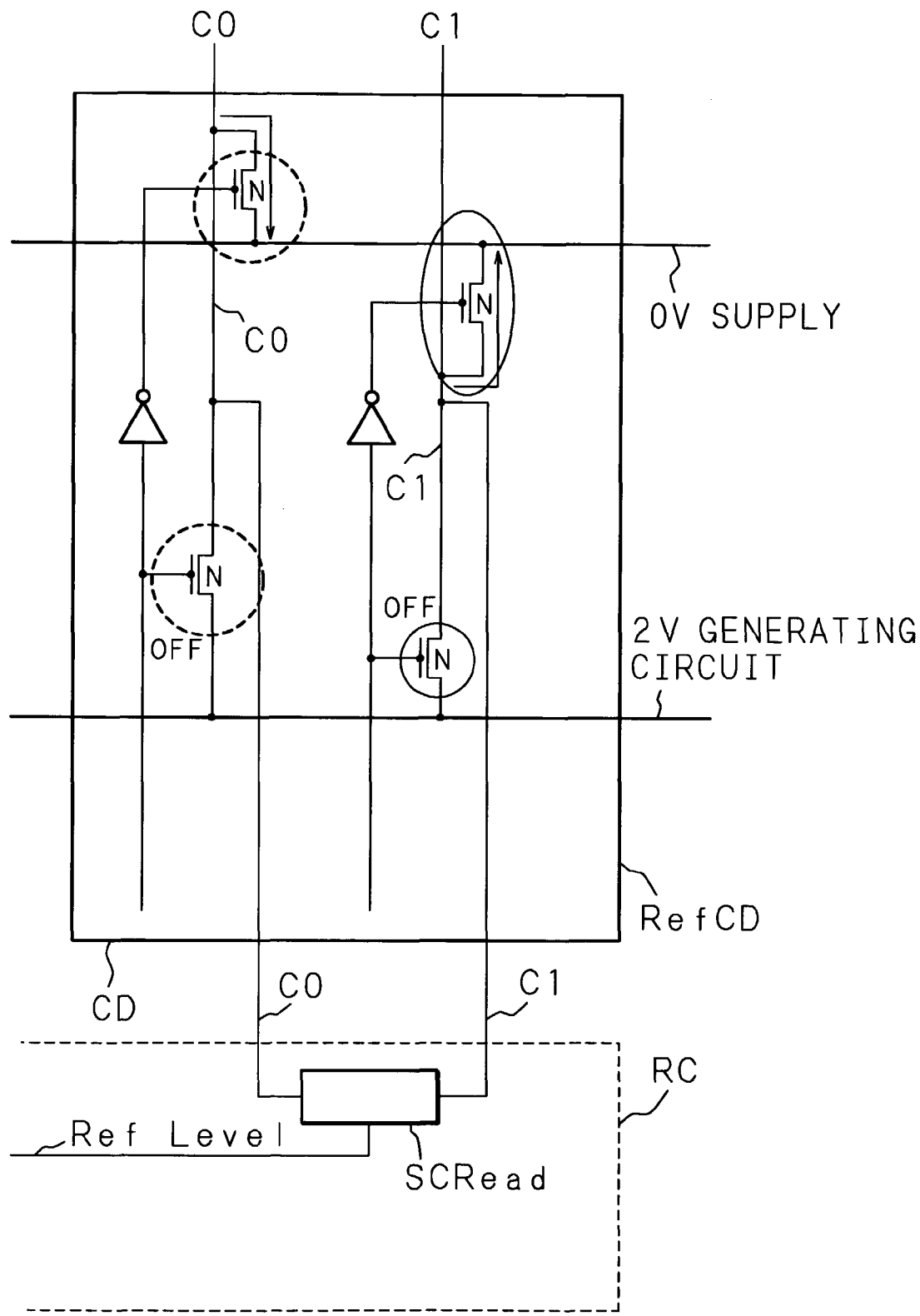
FIG. 28 is a circuit diagram illustrating a read operation for the memory cell in accordance with the present invention.
Figure 29:
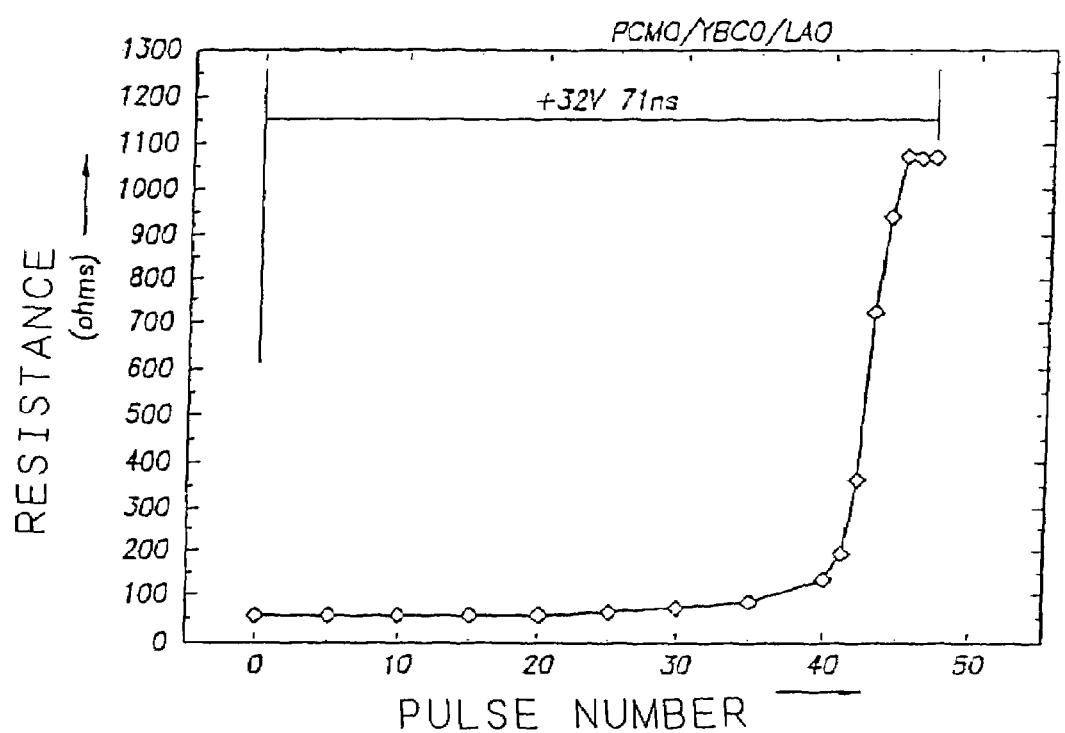
FIG. 29 is a graph showing the relationship between the number of applied pulses and a resistance value in the conventional technology.
Figure 30:
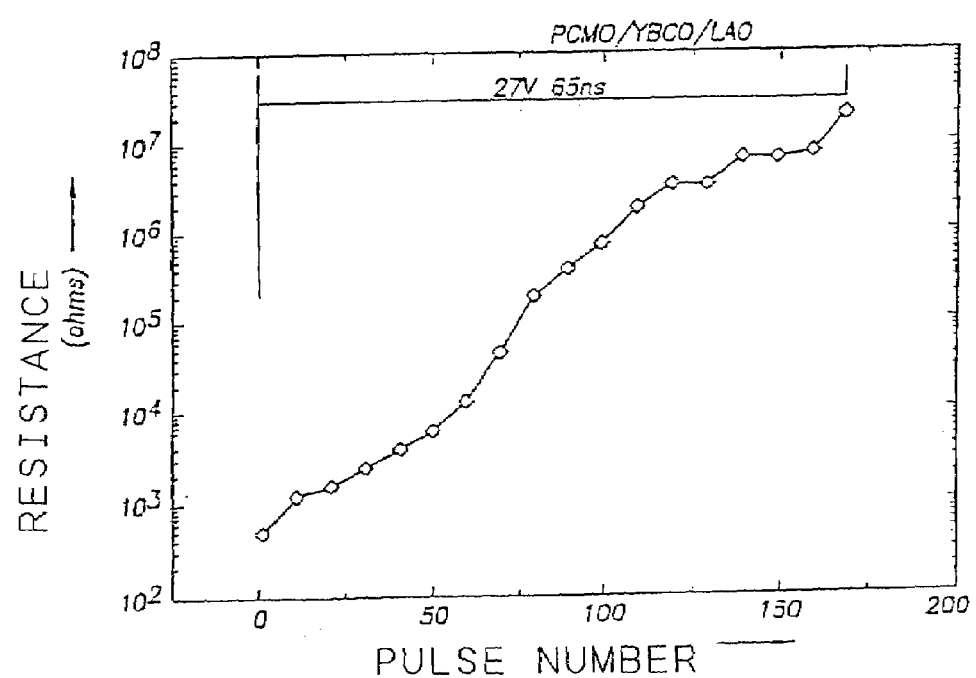
FIG. 30 is a graph showing the relationship between the number of applied pulses and a resistance value in the conventional technology.
Figure 31:
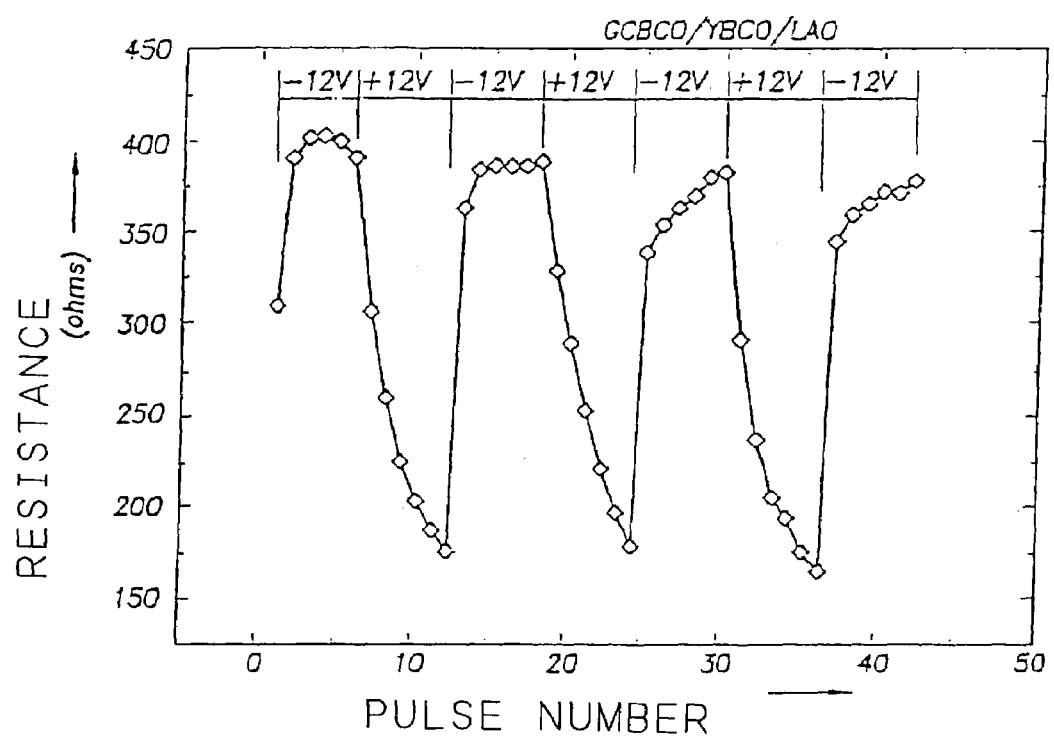
FIG. 31 is a graph showing the dependence of the relationship on pulse polarity in the conventional technology.
Figure 32:
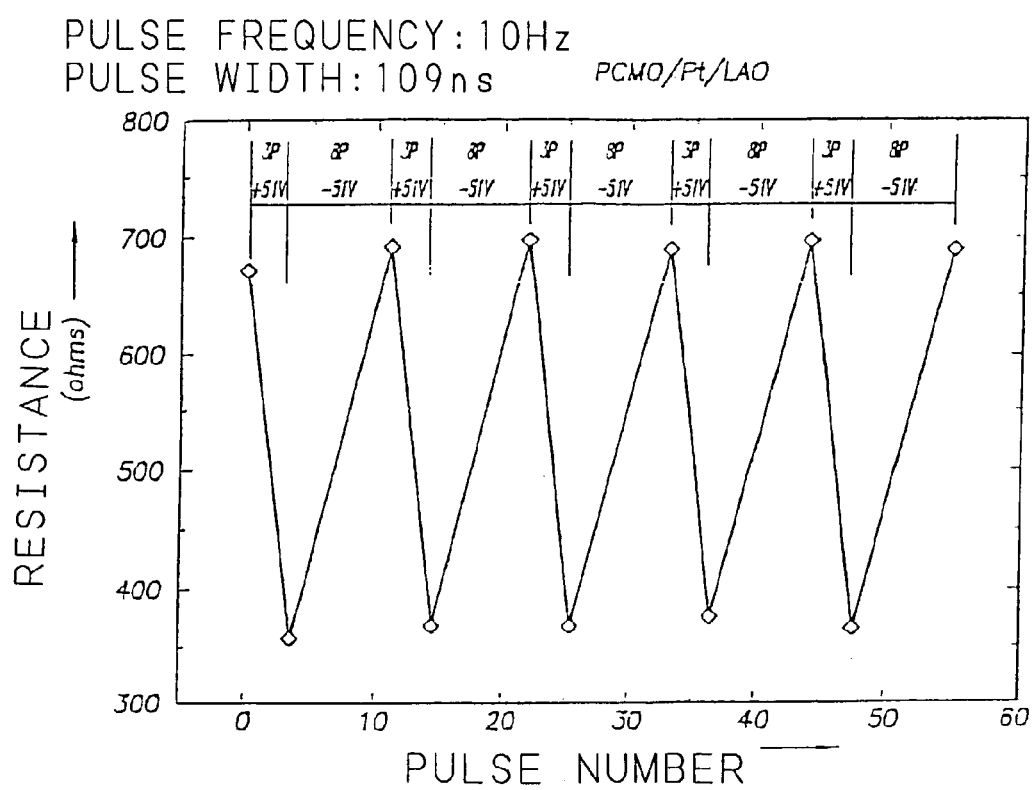
FIG. 32 is a graph showing the dependence of the relationship on pulse polarity in the conventional technology.
Figure 33:
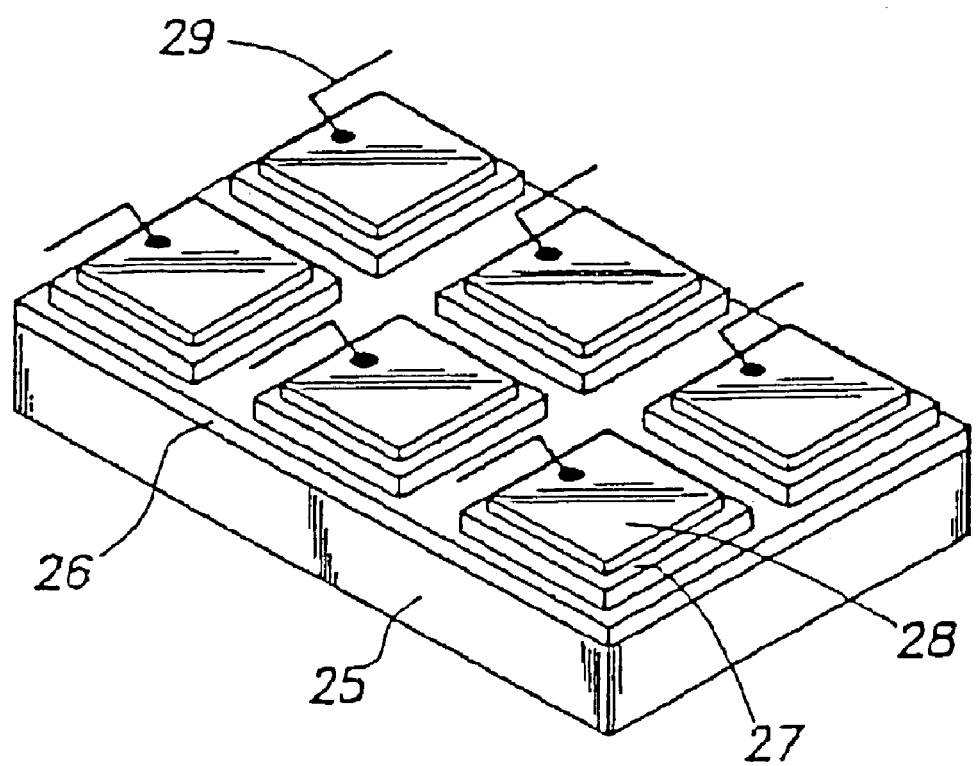
FIG. 33 is a perspective view showing a memory array configuration in accordance with the conventional technology.
Figure 34:
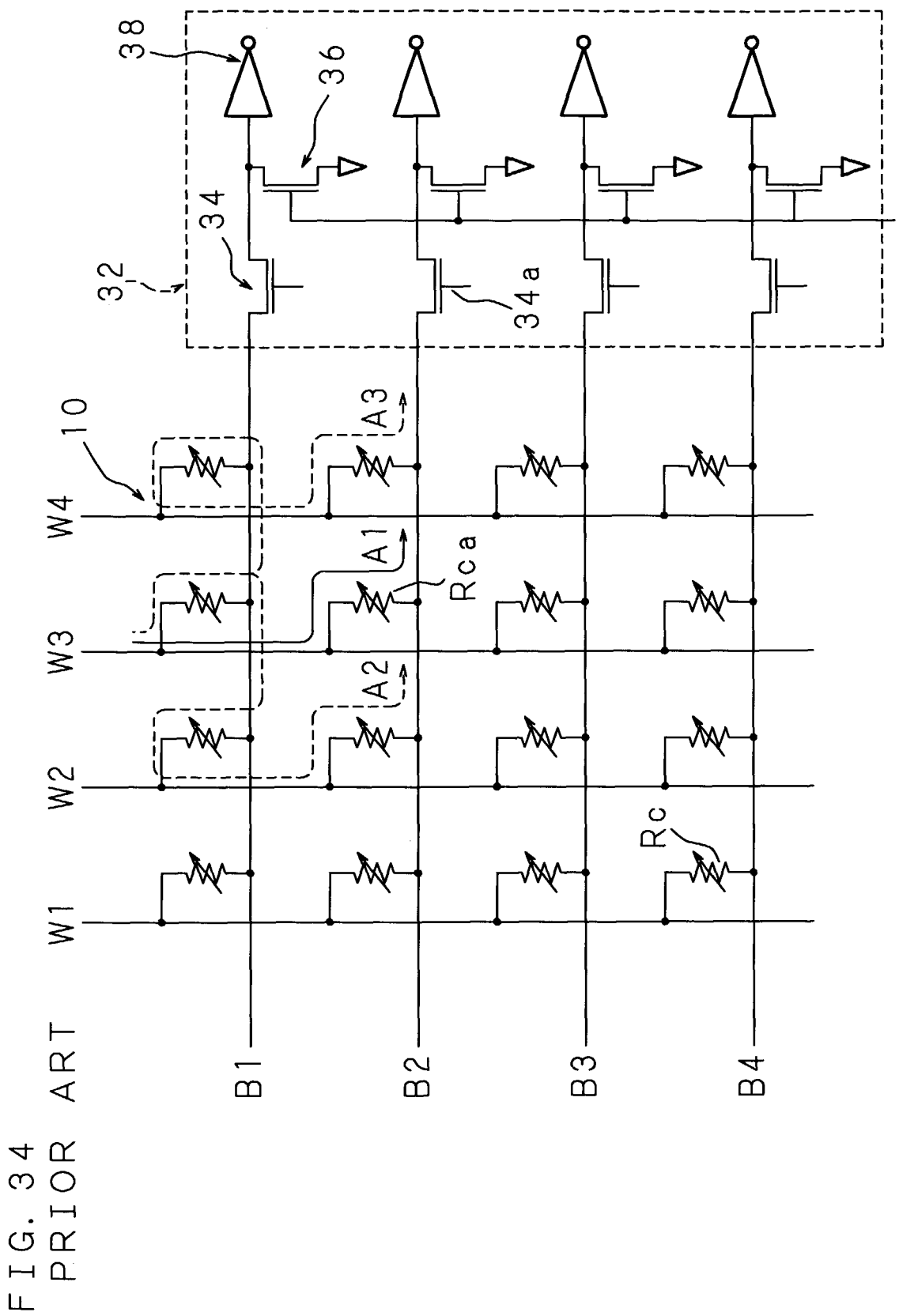
FIG. 34 is a circuit diagram showing a configuration example of the conventional memory array.

FIGS. 26, 27 and 28 are circuit diagrams illustrating a read operation for a memory cell in accordance with the present invention. When the memory array formed of the memory cells is inactive (in a precharge state), 0 V (the GND level) is applied to all the bit lines B1 to B8, and 0 V is applied to all the word lines W1 to W6, just as in the case of the write operation. In addition, 2 V is applied to the word line W2 connected to the selected memory cell MCa, and 0 V is applied to the bit line B2. Furthermore, at the other word lines W1 and W3 to W6, the 0 V application state remaining after the precharge state is maintained. Still further, on the basis of the column address signals (lines) CDS2, CDS4, CDS6 and CDS8 which have been input, 2 V is applied to the bit lines B4, B6 and B8 (FIG. 27) other than the bit line B2 connected to the selected memory cell MCa. Hence, a countermeasure is taken so that no potential difference occurs and no resistance value changes across each of the variable resistors other than the variable resistor in the selected memory cell MCa.

In addition to the drain current application drivers, a 2 V generating circuit J1, a read-use 1.5 V drive circuit (not shown; G1 at its inactive time), a read-use 1.5 V drive circuit (not shown; G2 at its inactive time), etc. are disposed for the word lines W1 to W6.

As shown in FIG. 27, on the basis of the column address signals (lines) CDS2, CDS4, CDS6 and CDS8 which have been input, only the Tr E0 connected to the bit line B2 connected to the selected memory cell MCa is turned OFF, and the other Trs E1, E2 and E3 in the column decoder CD are all turned ON. Hence, 2 V generated by the 2 V generating circuit can be supplied to the bit lines B4, B6 and B8 other than the bit line B2 connected to the selected memory cell MCa. In addition, on the basis of the column address signals (lines) CDS2, CDS4, CDS6 and CDS8 which have been input, only the Tr F0 for supplying 0 V to the bit line B2 is turned ON, and 0 V is supplied only to the bit line B2 connected to the selected memory cell MCa. As a result, as shown in FIG. 24, only one current path from the word line W2 through the diode and the variable resistor in the selected memory cell MCa to the bit line B2 is formed as indicated by arrow A, and the read operation is carried out.

Since 2 V is supplied as shown in FIGS. 26 and 27 from the Tr E1 of the column decoder CD to the memory cell MCb connected to the word line W2 connected to the read-use 2 V drive circuit that becomes active, no potential difference occurs and no resistance value changes across the terminals of the variable resistor in the memory cell MCb. In addition, in the memory cell MCc, the potential of the word line W1 connected to the diode in the memory cell MCc is 0 V, and the potential of the bit line B2 becomes 0 V, whereby no current path is formed and no resistance value changes. Hence, no change occurs in the resistance values of the variable resistors in the memory cells other than the selected memory cell MCa to be accessed.

The Ref Level serving as the reference value of the differential amplifier DIAP is generated by a Ref-use memory cell array RefMCA and a Ref-use column decoder RefCD. When the selected memory cell MCa is accessed, a memory cell RefA0 and a memory cell RefB0 for generating the Ref Level are accessed simultaneously. In addition, as shown in FIG. 28, 0 V is supplied to the Ref-use bit line C0 and the Ref-use bit line C1 of the Ref-use column decoder RefCD, whereby the data of the memory cell RefA0 and the data of the memory cell RefB0 are output to the Ref-use bit line C0 and the Ref-use bit line C1.

As described above, a large resistance value is set one side of the Ref-use memory cell array RefMCA in advance, and a small resistance value is set in the other side thereof in advance. Hence, the Ref-use bit line C0 read from the memory cell RefA0 has a low level, and the Ref-use bit line C1 read from the memory cell RefB0 has a high level. By doing short the signal of the Ref-use bit line C0 and the signal of the Ref-use bit line C1 at the readout short circuit SCRead in the readout circuit RC, an intermediate value of these signals is obtained. This level is input as the Ref Level of the differential amplifier DIAP in the readout circuit RC. The Ref Level is compared with the readout data output from the multiplexer MPX by the differential amplifier DIAP, whereby data stored in each memory cell MC is identified as 1 or 0 and a read operation is carried out.

[Embodiment 3]

In Embodiment 1, a case wherein an FET is used as a current controlling device is shown, and in Embodiment 2, a case wherein a diode is used as a current controlling device is shown. In Embodiment 3, a case wherein a bipolar transistor (hereafter also referred to as a BPT) is used instead of an FET as a current controlling device is shown.

Figure 35:
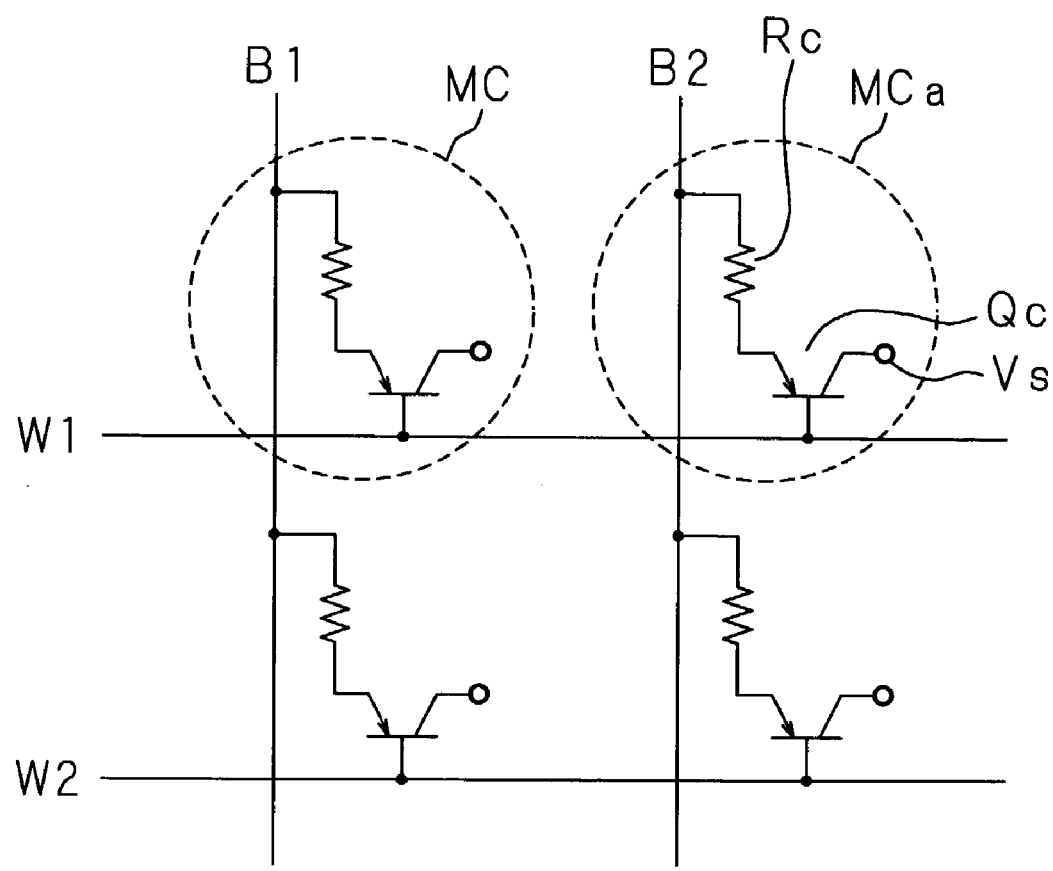
FIG. 35 is a view illustrating the configuration of a memory array in accordance with the present invention.

FIG. 35 is a view illustrating the configuration of a memory array in accordance with the present invention. The figure shows a state wherein memory cells MC are arranged in a 2 by 2 matrix to form a memory array. The memory cell MC is formed of a combination of a current controlling device Qc and a variable resistor Rc. The current controlling device Qc is formed of a BPT (hereafter, the current controlling device Qc formed of a BPT is also referred to as a BPT Qc). The BPT Qc is connected in series with the current path of the variable resistor Rc so as to control a current flowing through the variable resistor Rc. Since this memory cell MC is a combination of one current controlling device (bipolar transistor) Qc and one variable resistor Rc, it is referred to as a 1T1R type memory cell.

The collectors of the BPTs Qc are connected in common to a common-connected portion Vs (common potential portion Vs), the bases of the BPTs Qc are connected in common in the row direction, thereby forming word lines W1 and W2. The emitters of the BPTs Qc are each connected to one terminal of each of the variable resistor Rc, and the other terminals of the variable resistors Rc are connected in common in the column direction, thereby forming bit lines B1 and B2. In this way, a memory array is formed. The common-connected portion Vs in the matrix area may be divided into groups as necessary so that a potential is set for each group. Although a PNP transistor is used as the BPT, an NPN transistor may also be used. In addition, since the BPT has an excellent current controlling characteristic, accurate resistance control is made possible and a highly reliable memory device can be attained.

Examples of application voltages in each operation mode are described below by using a case wherein the memory cell MCa disposed at the intersection of the bit line B2 and the word line W1 is selected as an example. The application voltages are basically similar to those in the case of Embodiment 2 wherein a diode is used. In the case when an NPN transistor is used, a bias polarity and the like are required to be changed as necessary. Since the basic operations are similar to those explained in Embodiment 2, their detailed explanations are omitted. In addition, the common-connected portion Vs has a ground potential (0 V).

(Write Operation)

As a write voltage, 5 V for example is applied to the selected bit line B2, and 0 V is applied to the selected word line W1. A forward bias is applied between the emitter and the base of the BPT Qc so that a write current flows to the variable resistor Rc. Furthermore, 0 V is applied to the non-selected bit line B1, and 5 V identical to the write voltage is applied to the non-selected word line W2, thereby preventing the generation of leak currents at non-selected memory cells and preventing write disturb due to the leak currents.

(Reset Operation)

As a reset voltage, an appropriate voltage (for example, 1 V) is applied to the selected bit line B2, and 0 V is applied to the selected word line W1. A forward bias is applied between the emitter and the base of the BPT Qc so that a reset current flows to the variable resistor Rc. Furthermore, 0 V is applied to the non-selected bit line B 1, and a voltage identical to the reset voltage is applied to the non-selected word line W2, thereby preventing the generation of leak currents at non-selected memory cells and preventing reset disturb due to the leak currents.

(Read Operation)

As a read voltage, 2 to 3 V for example is applied to the selected bit line B2, and 0 V is applied to the selected word line W1. A forward bias is applied between the emitter and the base of the BPT Qc so that a read current flows to the variable resistor Rc. Furthermore, 0 V is applied to the non-selected bit line B1, and a voltage identical to the read voltage or more is applied to the non-selected word line W2, thereby preventing the generation of leak currents at non-selected memory cells and preventing read disturb due to the leak currents.

Figure 36A:
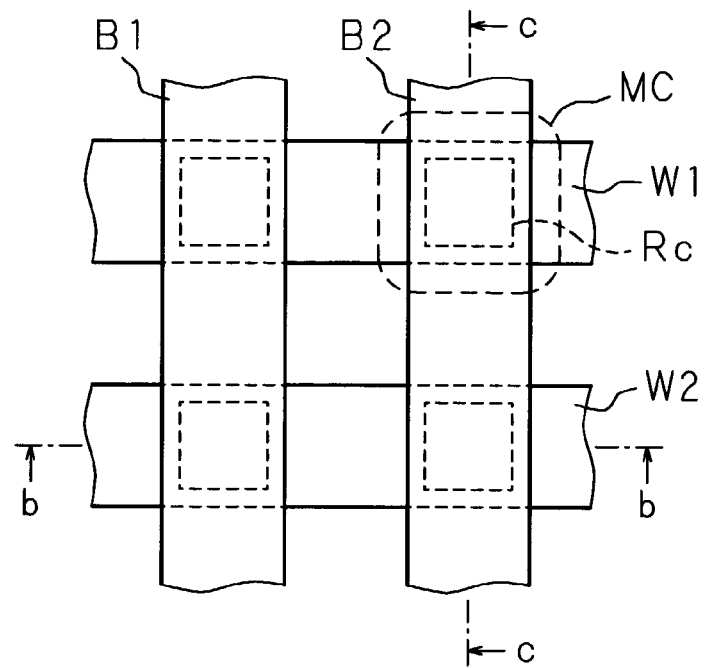
FIG. 36A is a schematic plan view showing the memory array shown in FIG. 35.
Figure 36B:
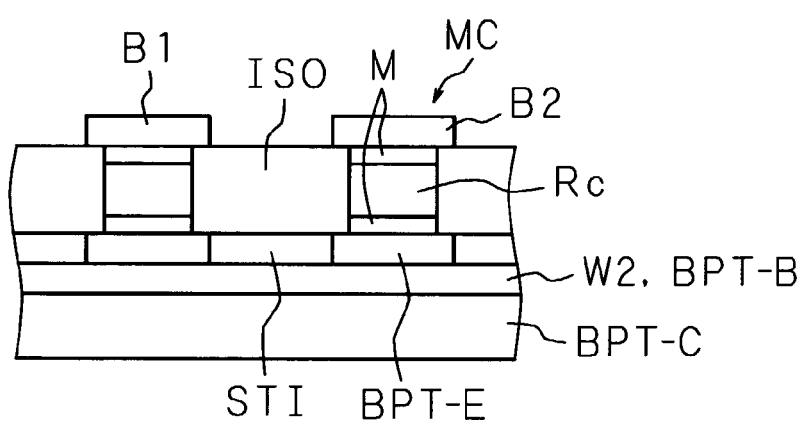
FIG. 36B is a schematic sectional view taken on arrow bb of FIG. 36A.
Figure 36C:
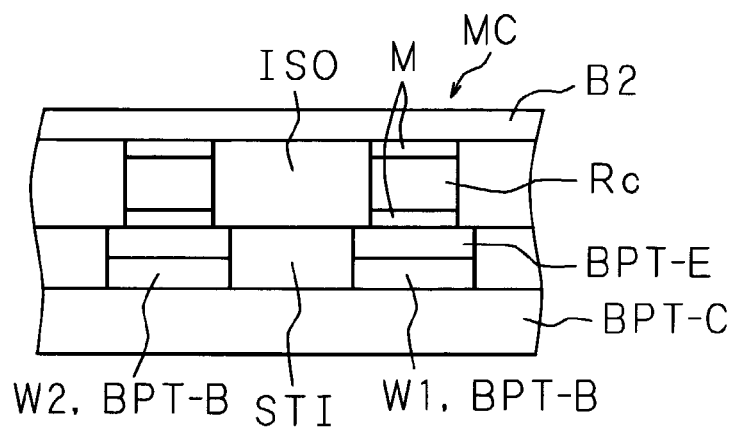
FIG. 36C is a schematic sectional view taken on arrow cc of FIG. 36A.

FIGS. 36A to 36C are explanatory views schematically showing the configuration of a memory array in accordance with the present invention. FIG. 36A is a schematic plan view showing the memory array of FIG. 35, wherein the same components are designated by the same codes. FIG. 36B is a schematic sectional view taken on arrow bb of FIG. 36A. FIG. 36C is a schematic sectional view taken on arrow cc of FIG. 36A. In FIG. 36A, the word lines W1 and W2 are formed in parallel in the row direction so as to have an appropriate distance therebetween. The bit lines B1 and B2 are formed in the column direction so as to intersect with the word lines W1 and W2 and have an appropriate distance therebetween. Memory cells MC are formed at all the intersections of the word lines W1 and W2 and the bit lines B1 and B2. In each memory cell MC, the variable resistor Rc is formed so as to be overlaid at each of portions wherein the bit lines B1 and B2 are overlaid on the word lines W1 and W2 formed on a substrate (not shown).

In FIG. 36B, the word line W2 is formed on the collector area BPT-C of the BPT Qc configured as a substrate-like area. Since the BPT Qc is a PNP transistor, the collector area BPT-C has P-type conductivity and is formed of a P-type silicon substrate or the like, for example. The substrate-like collector area BPT-C functions as a common-connected portion. The word line W2 and the base area BPT-B are each configured by forming an N (N+) conductive diffusion layer on the collector area BPT-C. In the memory cell MC, the word line W2 is also used as the base areas BPT-B. The emitter area BPT-E of the BPT Qc is configured by forming a P (P+) conductive diffusion layer on the base area BPT-B. An isolation layer STI (Shallow Trench Isolation) is formed as necessary between the emitter areas BPT-E adjacent to each other to isolate the emitter areas BPT-E from each other. The variable resistor Rc is formed between each emitter area BPT-E and each of the bit lines B1 and B2. A contact metal layer M is formed between the variable resistor Rc and the emitter area BPT-E, and a contact metal layer M is also formed between the variable resistor Rc and each of the bit lines B1 and B2. For example, platinum (Pt), iridium, etc. can be used for the contact metal layers M. An isolation layer ISO (Isolation) is formed as necessary between the memory cells MC adjacent to each other to isolate the memory cells MC from each other. In FIG. 36C, the word line W1 is also shown in addition to the word line W2 shown in FIG. 36B. In the other respects, FIG. 36C is similar to FIG. 36B, and its detailed explanation is omitted.

As described above, in the memory cell in accordance with the present invention, the word line formed of a diffusion layer diffused to the substrate-like collector area BPT-C can also be used as the base area BPT-B. In addition, since the emitter area BPT-E is formed of a diffusion layer diffused to the base area BPT-B, the base area BPT-B and the emitter area BPT-E can be formed so as to be perpendicular to the substrate-like collector area BPT-C. In addition, since the variable resistor is formed so as to be overlaid on the emitter area BPT-E, the dimensions in the sideway directions (the plane pattern shape) can be reduced to ultimate limits, whereby memory cells suited for a large-capacity memory device can be configured.

In the case when the BPT Qc is an NPN transistor, the collector area BPT-C should be the N type, the base area BPT-B should be the P (P+) type, and the emitter area BPT-E should be the N (N+) type. It is also possible to form an NPN transistor on a P-type silicon substrate.

A memory device can be configured by connecting peripheral circuits similar to those in accordance with Embodiments 1 and 2 to the memory cells (a memory array) shown in FIGS. 36A to 36C. In other words, a row decoder for selecting the word lines W1 and W2 is connected to the word lines W1 and W2, a column decoder for selecting the bit lines B1 and B2 is connected to the bit lines B1 and B2, and the readout circuit for reading memory data in the memory cells is connected to the column decoder. With this configuration, it is possible to obtain a memory device having effects similar to those in accordance with Embodiments 1 and 2.

As described above, in accordance with the present invention, a memory cell comprising a variable resistor made of a thin-film material having a perovskite structure is configured as the 1T1R type or the 1D1R type. The memory cells are arranged in a matrix to form a memory array. By using the above-mentioned access method, the memory array serves as a nonvolatile memory device and can carry out reset and read operations by random access (operation in 1 bit unit).

In addition, the present invention can provide memory cells that can operate at a low voltage and be highly integrated, and can also provide a memory array (a memory device) comprising the memory cells. In addition, the peripheral circuits are configured so that when a memory cell is accessed, the generation of leak currents to adjacent memory cells can be prevented, whereby the memory device is highly reliable and useful. Furthermore, each of write, reset and read operations can be carried out at a high speed of 100 ns or less. Still further, the memory device does not require any boosting circuit or verifying operation.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A memory cell comprising:
   a variable resistor; and
   a current controlling device for controlling a current flowing through said variable resistor,
   wherein said current controlling device is controlled by a bit line, a word line, and a source drive line,
   wherein said bit line is connected to a column address signal unit of a column decoder, said column address signal unit comprises
      said word line connected to a row decoder for selecting said word line, said bit line connected to said column decoder for selecting said bit line, and a readout circuit connected to said column decoder to read memory data from said memory cell.

2. A memory cell in accordance with claim 1, wherein said current controlling device is a field-effect transistor.

3. A memory cell in accordance with claim 1, wherein said current controlling device is a diode.

4. A memory cell in accordance with claim 1, wherein said current controlling device is a bipolar transistor.

5. A memory cell in accordance with claim 2, wherein said variable resistor has a resistance body of a perovskite structure.

6. A memory cell in accordance with claim 3, wherein said variable resistor has a resistance body of a perovskite structure.

7. A memory cell in accordance with claim 4, wherein said variable resistor has a resistance body of a perovskite structure.

8. A memory device formed of a plurality of memory cells arranged in a matrix, comprising:

said memory cells, each comprising a variable resistor and a field-effect transistor for controlling a current flowing through said variable resistor;

word lines for connecting the gates of said field-effect transistors in common in the row direction of said matrix;

source drive lines for connecting the sources of said field-effect transistors in common in said row direction; and bit lines for connecting one terminal of each of said variable resistors in common in the column direction of said matrix, wherein the drains of said field-effect transistors are connected to the other terminals of said variable resistors.

9. A memory device in accordance with claim 8, wherein said word lines are connected to a row decoder for selecting said word lines, said bit lines are connected to a column decoder for selecting said bit lines, and a readout circuit is connected to said column decoder to read memory data from said memory cells.

10. A memory device formed of a plurality of memory cells arranged in a matrix, comprising:

said memory cells, each comprising a variable resistor and a diode for controlling a current flowing through said variable resistor;

word lines for connecting the anodes of said diodes in common in the row direction of said matrix; and bit lines for connecting one terminal of each of said variable resistors in common in the column direction of said matrix, wherein the cathodes of said diodes are connected to the other terminals of said variable resistors.

11. A memory device in accordance with claim 10, wherein said word lines are connected to a row decoder for selecting said word lines, said bit lines are connected to a column decoder for selecting said bit lines, a readout circuit is connected to said column decoder to read memory data from said memory cells.

12. A memory device formed of a plurality of memory cells arranged in a matrix, comprising:

said memory cells, each comprising a variable resistor and a bipolar transistor for controlling a current flowing through said variable resistor;

a common-connected portion for connecting the collectors of said bipolar transistors in common;

word lines for connecting the bases of said bipolar transistors in common in the row direction of said matrix;

bit lines, for connecting one terminal of each of said variable resistors in common in the column direction of said matrix, wherein the emitters of said bipolar transistors are connected to the other terminals of said variable resistors.

13. A memory device in accordance with claim 12, wherein said word lines are connected to a row decoder for selecting said word lines, said bit lines are connected to a column decoder for selecting said bit lines, and a readout circuit is connected to said column decoder to read memory data from said memory cells.

14. A memory device in accordance with claim 9, wherein said variable resistor has a resistance body of a perovskite structure.

15. A memory device in accordance with claim 11, wherein said variable resistor has a resistance body of a perovskite structure.

16. A memory device in accordance with claim 13, wherein said variable resistor has a resistance body of a perovskite structure.

17. A memory cell comprising:

a variable resistor; and a current controlling device for controlling a current flowing through said variable resistor, wherein said current controlling device is controlled by a bit line, a word line, and a source drive line, wherein the bit line is coupled to a column address signal unit of a column decoder, the column address signal unit comprises a first transistor having a drain terminal coupled to a first potential line, a gate terminal coupled to a column address signal line, and a source terminal coupled to the bit line, and a second transistor having a drain terminal coupled to a second potential line, a gate terminal coupled to an inverse of the column address signal line, and a source terminal coupled to the bit line.

18. A memory device in accordance with claim 17, wherein the column address signal unit further comprises:

a third transistor having a gate terminal coupled to the inverse of the column address signal line, a drain terminal coupled to a readout circuit, and a source terminal coupled to a third potential line.

19. A memory device in accordance with claim 18, wherein the readout circuit comprises:

a multiplexer for receiving a signal from the drain terminal of the third transistor; and a differential amplifier for comparing an output signal of the multiplexer to a reference level signal.

* * * * *